US011479852B2

(12) United States Patent
Sato et al.

(10) Patent No.: US 11,479,852 B2
(45) Date of Patent: Oct. 25, 2022

(54) METHOD FOR DRY CLEANING A SUSCEPTOR AND SUBSTRATE PROCESSING APPARATUS

(71) Applicant: Tokyo Electron Limited, Tokyo (JP)

(72) Inventors: Jun Sato, Iwate (JP); Shigehiro Miura, Yamanashi (JP); Takashi Chiba, Iwate (JP)

(73) Assignee: Tokyo Electron Limited, Tokyo (JP)

( * ) Notice: Subject to any disclaimer, the term of this patent is extended or adjusted under 35 U.S.C. 154(b) by 246 days.

(21) Appl. No.: 16/418,115

(22) Filed: May 21, 2019

(65) Prior Publication Data
US 2019/0360092 A1    Nov. 28, 2019

(30) Foreign Application Priority Data

May 23, 2018    (JP) .............................. JP2018-098465

(51) Int. Cl.
  *C23C 16/44*    (2006.01)
  *C23C 16/455*   (2006.01)
  *H01J 37/32*    (2006.01)
  *H01L 21/687*   (2006.01)

(52) U.S. Cl.
  CPC .... *C23C 16/4405* (2013.01); *C23C 16/45544* (2013.01); *C23C 16/45565* (2013.01); *H01J 37/32449* (2013.01); *H01J 37/32715* (2013.01); *H01L 21/68757* (2013.01); *H01J 2237/335* (2013.01); *H01J 2237/3321* (2013.01); *H01J 2237/3341* (2013.01)

(58) Field of Classification Search
  None
  See application file for complete search history.

(56) References Cited

U.S. PATENT DOCUMENTS

| 2010/0122710 A1* | 5/2010 | Kato ................. H01L 21/67028 134/1 |
| 2014/0011370 A1* | 1/2014 | Kato ................. H01J 37/32449 438/782 |
| 2018/0155829 A1* | 6/2018 | Tamura ................. C23C 22/34 |

FOREIGN PATENT DOCUMENTS

| JP | 2013-191802 | 9/2013 | |
| JP | 2013-207301 | 10/2013 | |
| JP | 2015-142038 | 8/2015 | |
| WO | WO-2013146278 A1 * | 10/2013 | ......... C23C 16/4405 |

OTHER PUBLICATIONS

WO2013146278A1 English Translation, accessed on Jul. 2021. (Year: 2015).*

* cited by examiner

*Primary Examiner* — Eric W Golightly
*Assistant Examiner* — Arlyn I Rivera-Cordero
(74) *Attorney, Agent, or Firm* — IPUSA, PLLC

(57) ABSTRACT

A method for dry cleaning a susceptor is performed after a substrate is removed from a processing chamber of a substrate processing apparatus. In the method, a cleaning gas for dry cleaning is supplied to a first region including a substrate receiving region in the susceptor. The cleaning gas is regionally supplied to a second region where the cleaning gas is difficult to reach when the cleaning gas is supplied to the first region.

5 Claims, 14 Drawing Sheets

METHOD FOR DRY CLEANING A SUSCEPTOR AND SUBSTRATE PROCESSING APPARATUS

CROSS-REFERENCE TO RELATED APPLICATION

The present application is based on and claims priority to Japanese Priority Application No. 2018-098465 filed on May 23, 2018, the entire contents of which are hereby incorporated herein by reference.

BACKGROUND OF THE INVENTION

1. Field of the Invention

The present disclosure relates to a method for dry cleaning a susceptor and a substrate processing apparatus.

2. Description of the Related Art

Conventionally, as described in Japanese Patent Application Publication No. 2013-191802, a method of manufacturing a semiconductor device for dry cleaning the inside of a chamber is known after removing a substrate and before placing the next substrate on an electrostatic chuck. The method of manufacturing the semiconductor device described in Japanese Patent Application Publication No. 2013-191802 adopts dry cleaning using a cleaning gas converted to plasma, in order to remove the reaction product attached to the inner wall of the chamber when the semiconductor wafer is etched.

Such dry cleaning can reduce particle generation in the semiconductor device manufacturing process.

Meanwhile, the dry cleaning performed in the substrate processing apparatus depends on the type of the substrate processing, the configuration of the substrate processing apparatus, and the like. For example, in Japanese Patent Application Publication No. 2013-191802, the dry cleaning is performed while cooling the electrostatic chuck in order to reduce damage to the electrostatic chuck during the dry cleaning. On the other hand, in the dry cleaning of a film deposition apparatus, the dry cleaning is performed to remove a thin film deposited on a susceptor on which a substrate is mounted. The dry cleaning of such a film deposition apparatus requires removal of the reaction product on the susceptor, and preferably removes the reaction product uniformly on the entire surface of the susceptor. Similarly, in the etching apparatus described above, the reaction product is preferably removed uniformly.

SUMMARY OF THE INVENTION

The present disclosure is intended to provide a method for dry cleaning a susceptor and a substrate processing apparatus capable of uniformly cleaning a surface of the susceptor.

According to an embodiment, there is provided a method for dry cleaning a susceptor performed after a substrate is removed from a processing chamber of a substrate processing apparatus. In the method, a cleaning gas for dry cleaning is supplied to a first region including a substrate receiving region in the susceptor. The cleaning gas is regionally supplied to a second region where the cleaning gas is difficult to reach when the cleaning gas is supplied to the first region.

Additional objects and advantages of the embodiments are set forth in part in the description which follows, and in part will become obvious from the description, or may be learned by practice of the disclosure. The objects and advantages of the disclosure will be realized and attained by means of the elements and combinations particularly pointed out in the appended claims. It is to be understood that both the foregoing general description and the following detailed description are exemplary and explanatory and are not restrictive of the disclosure as claimed.

DETAILED DESCRIPTION OF THE PREFERRED EMBODIMENTS

Embodiments of the present disclosure are described below with reference to the accompanying drawings.

[Substrate Processing Apparatus]

To begin with, a substrate processing apparatus according to an embodiment of the present disclosure is described below. Although the present disclosure can be applied to a variety of substrate processing apparatus such as a CVD (Chemical Vapor Deposition) apparatus and an etching apparatus, in the present embodiments, an example of forming the substrate processing apparatus as an ALD (Atomic Layer Deposition) apparatus is described below.

Figure 1:
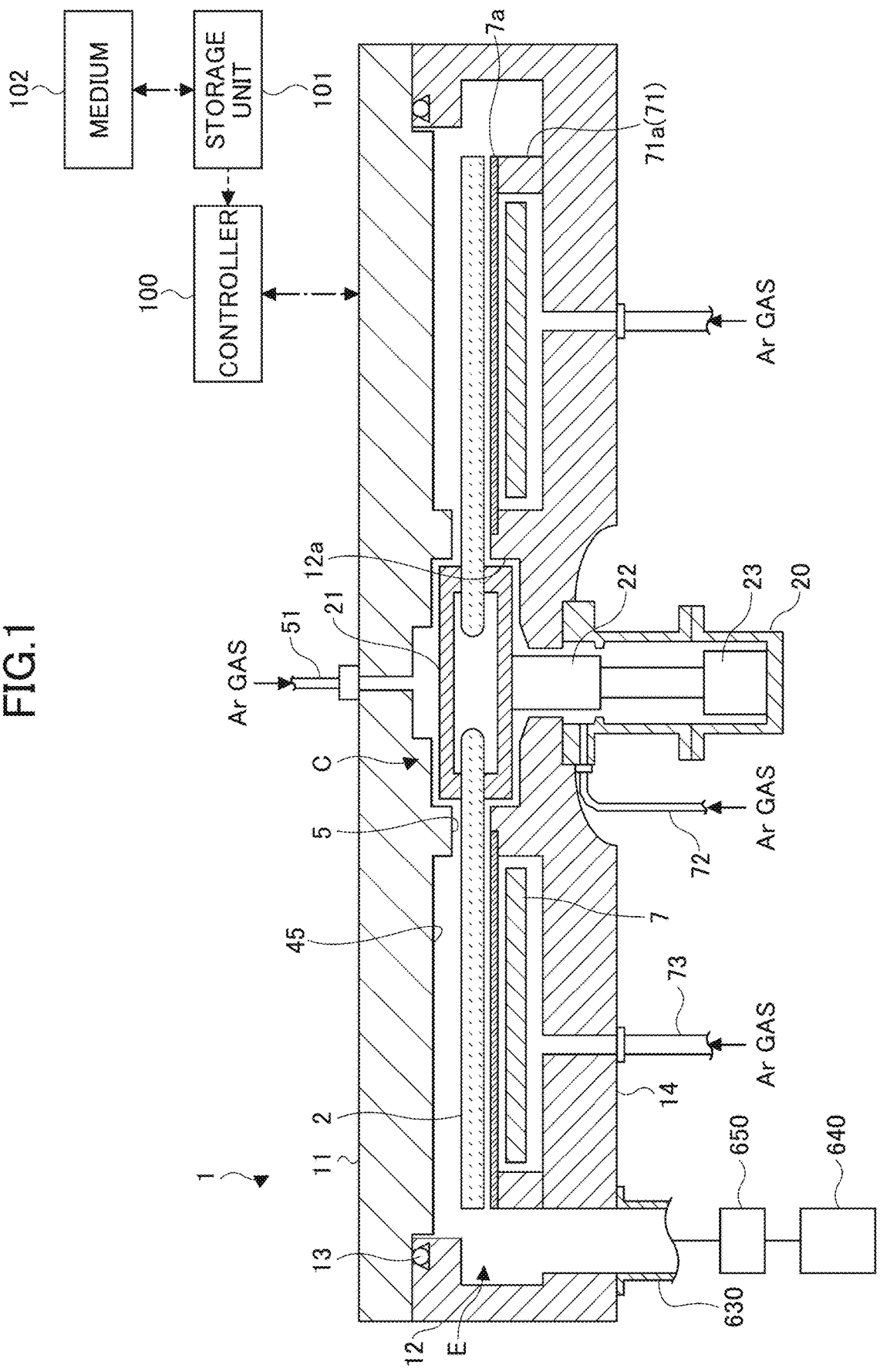
FIG. 1 is a cross-sectional view of a substrate processing apparatus according to an embodiment of the present disclosure.
Figure 2:
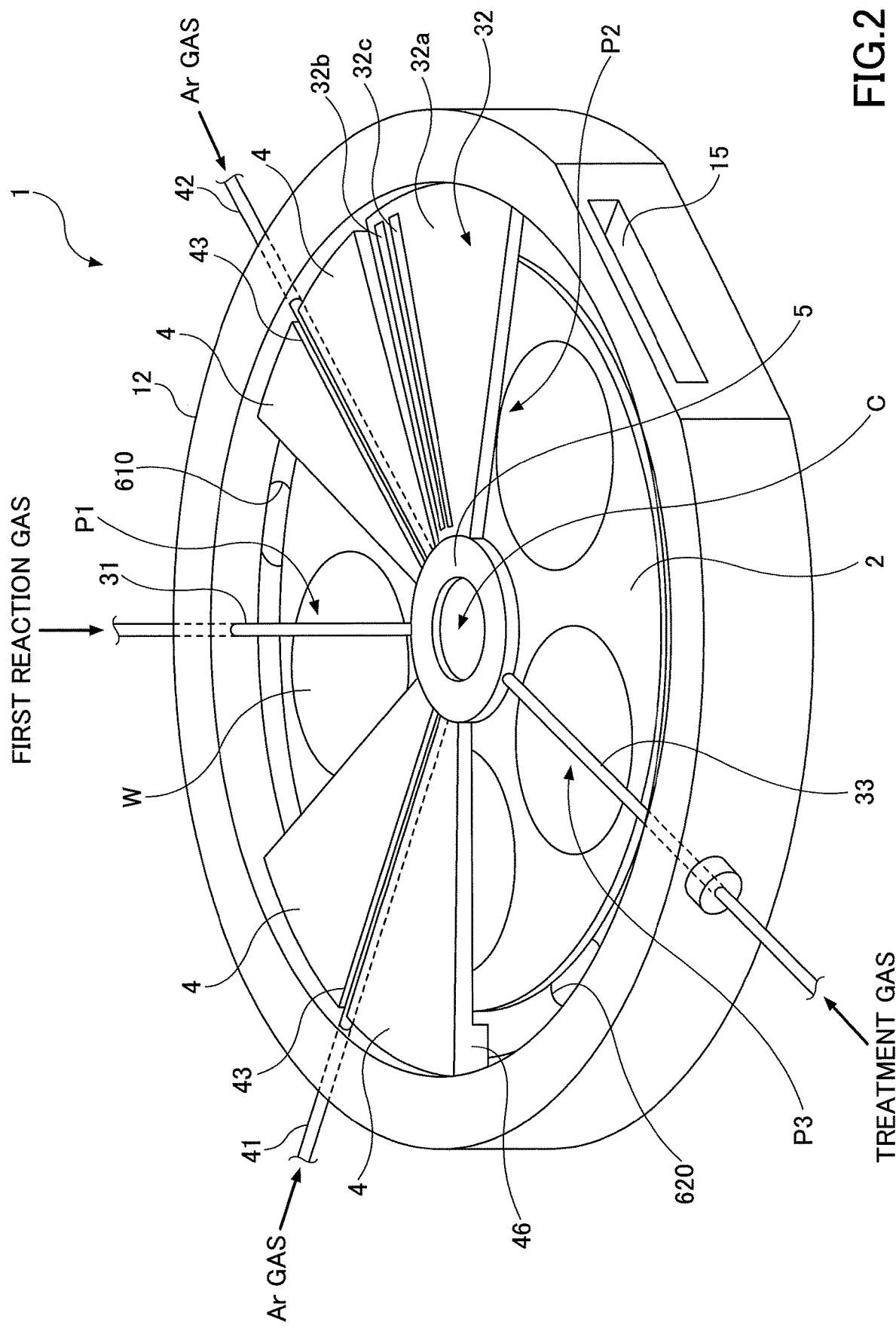
FIG. 2 is a schematic perspective view illustrating a configuration of a substrate processing apparatus in a vacuum container according to an embodiment of the present invention.
Figure 3:
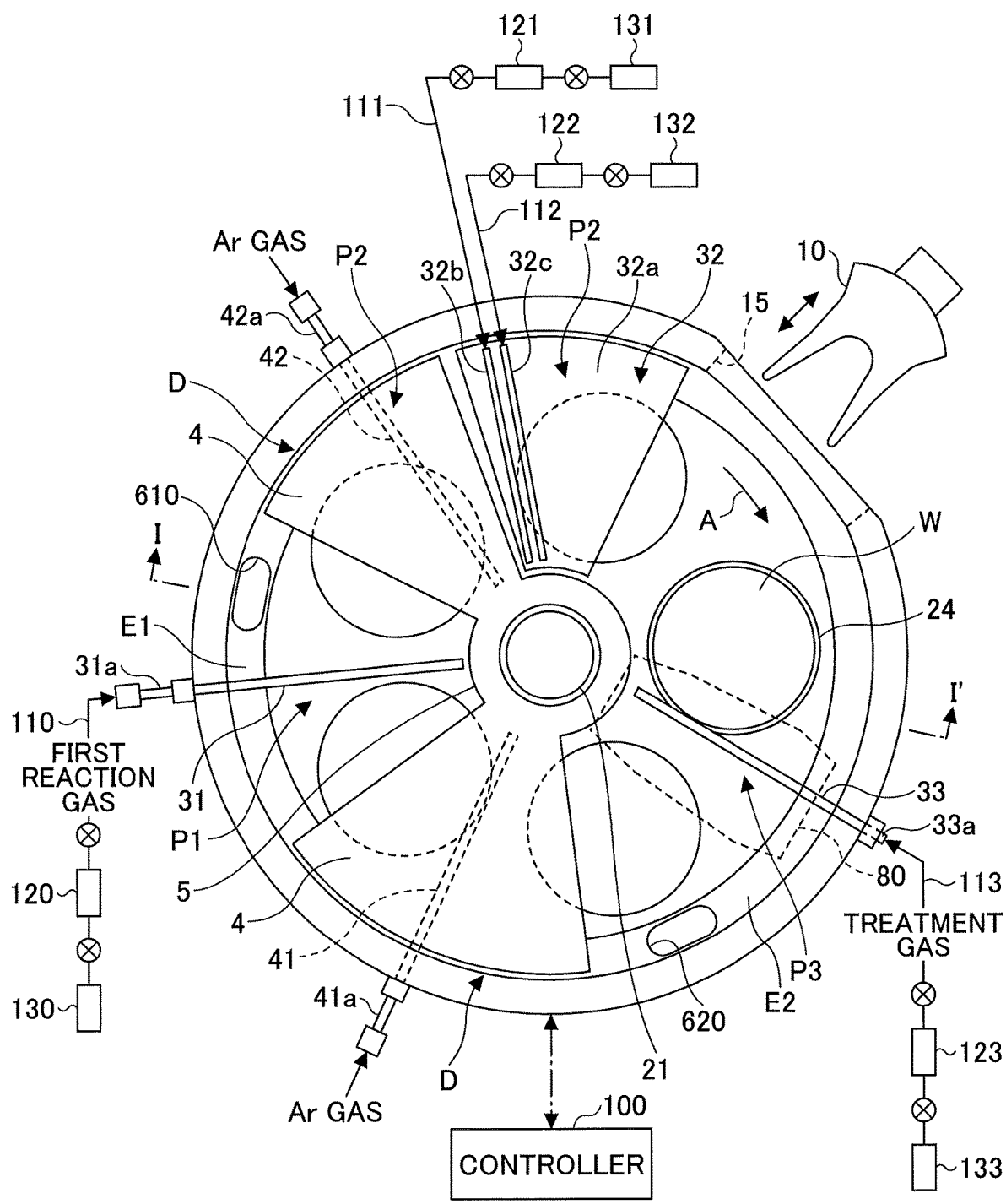
FIG. 3 is a schematic plan view illustrating a configuration of a film deposition apparatus in a vacuum chamber according to an embodiment of the present invention.

FIG. 1 is a cross-sectional view of a substrate processing apparatus according to an embodiment of the present disclosure. FIG. 2 is a schematic perspective view illustrating a configuration of the substrate processing apparatus in a vacuum chamber according to the embodiment of the present invention. FIG. 3 is a schematic plan view illustrating a configuration of the film deposition apparatus in the vacuum chamber according to the embodiment of the present disclosure.

With reference to FIGS. 1 through 3, the film deposition apparatus includes a vacuum chamber 1 having a substantially flat circular shape, and a susceptor 2 provided in the vacuum chamber 1. The susceptor 2 has a rotational axis coincident with the center of the vacuum chamber 1. The vacuum chamber 1 is a process chamber to accommodate a wafer therein and to deposit a film on a surface of the wafer. The vacuum chamber 1 includes a chamber body 12 having a cylindrical shape with a bottom surface, and a ceiling plate 11 placed on the upper surface of the chamber body 12. The ceiling plate 11 is detachably placed on the chamber body 12 via a sealing member 13 (see FIG. 1) such as an O-ring in an airtight manner.

The susceptor 2 is attached to a cylindrical shaped core unit 21 at its center portion. The core unit 21 is fixed to the upper end of a rotary shaft 22 that extends in the vertical direction. The rotary shaft 22 is provided to penetrate through a bottom portion 14 of the vacuum chamber 1, and the lower end of the rotary shaft 22 is attached to a driving unit 23 that rotates the rotary shaft 22 (FIG. 1) about a vertical axis. The rotary shaft 22 and the driving unit 23 are housed in the cylindrical case body 20 whose upper surface is open. The case body 20 is attached to a lower surface of the bottom portion 14 of the vacuum chamber 1 via a flange portion provided at its upper surface in an airtight manner so that inner atmosphere of the case body 20 is isolated from the external atmosphere.

As illustrated in FIGS. 2 and 3, a plurality of (five in the example of the drawing) circular recesses 24 is provided in a top surface of the susceptor 2 along a rotational direction (circumferential direction) to receive the plurality of semiconductor wafers (which will be simply referred to as "wafers" hereinafter) W, respectively. In FIG. 3, only a single wafer W is illustrated in one of the recesses 24 for an explanatory purpose. Each of the recesses 24 is formed to have a slightly larger (for example, 4 mm larger) diameter than that (for example, 300 mm) of the wafer W, and to have a depth substantially equal to the thickness of the wafer W. Thus, when the wafer W is placed in the respective recess 24, the surface of the wafer W and the surface of the susceptor 2 (where the wafer W is not placed) become almost the same height. Each of the recesses 24 has three, for example, through holes formed in the bottom, through which lift pins for supporting a back surface of the respective wafer W and lifting the wafer W penetrate.

FIGS. 2 and 3 are diagrams for explaining an inner structure of the vacuum chamber 1. The ceiling plate 11 is not illustrated in FIGS. 2 and 3 for an explanatory purpose. As illustrated in FIGS. 2 and 3, a reaction gas nozzle 31, a showerhead 32, a reaction gas nozzle 33, and separation gas nozzles 41 and 42, which are made of quartz, for example, are provided above the susceptor 2. In the example illustrated in FIG. 3, the reaction gas nozzle 33, the separation gas nozzle 41, the reaction gas nozzle 31, the separation gas nozzle 42, and the showerhead 32 are arranged in this order from a transfer port 15 (which will be explained later) in a clockwise direction (the rotation direction of the susceptor 2 as illustrated by an arrow A in FIG. 3) with a space therebetween in a circumferential direction of the vacuum chamber 1. The reaction gas nozzle 31, the showerhead 32, the reaction gas nozzle 33, and the separation gas nozzles 41 and 42 are all gas supply units for supplying gases on the susceptor 2. The showerhead 32 is a gas supply unit for spraying a gas in a shower-like manner, and in FIGS. 2 and 3 illustrate an upper surface of the bottom surface 32a on which a gas discharge hole (not shown in FIGS. 2 and 3) is formed. The showerhead 32 includes a cleaning gas supply part 32b for supplying a cleaning gas and a second reaction gas supply part 32c for supplying a second reaction gas.

Gas introduction ports 31a, 33a, 41a, and 42a (FIG. 3) that are base portions of the nozzles 31, 33, 41, and 42, respectively, are fixed to an outer peripheral wall of the chamber body 12 so that these nozzles 31, 33, 41, and 42 are introduced into the vacuum chamber 1 from the outer peripheral wall of the vacuum chamber 1 so as to extend in a radial direction and parallel to the surface of the susceptor 2. On the other hand, a gas introduction port of the showerhead 32 is placed on the top surface of the vacuum chamber 1, which will be discussed below. The cleaning gas supply portion 32b and the second reaction gas supply portion 32c provided on the bottom surface 32a of the showerhead 32 are also provided to extend horizontally with respect to the susceptor 2 along the radial direction of the susceptor 2.

In this embodiment, as illustrated in FIG. 3, the reaction gas nozzle 31 is connected to a supply source 130 of a source gas via a pipe 110, a flow controller 120 and the like (not illustrated in the drawings). The showerhead. 32 is connected to a supply source 132 (not illustrated in the drawings) of a treatment gas via a pipe 112, a flow controller 122 and the like (not illustrated in the drawings). The reaction gas nozzle 33 is connected to a supply source 133 (not illustrated in the drawings) of chlorine ($Cl_2$) gas via a pipe 113, a flow controller 123 and the like (not illustrated in the drawings). The separation gas nozzles 41 and 42 are connected to supply sources (not illustrated in the drawings) of a separation gas via pipes and flow controller valves and the like, respectively. A noble gas such as helium (He) or argon (Ar) or inert gas such as nitrogen ($N_2$) gas can be used as the separation gas. The present embodiment is described by citing an example of using Ar gas as the separation gas.

Each of the reaction gas nozzles 31 and 33 has a plurality of gas discharge holes 35 that faces downward to the susceptor 2 along the longitudinal directions of each of the reaction gas nozzles 31 and 33 at intervals of 10 mm, for example. Similarly, a plurality of gas discharge holes 36 and 37 (see FIG. 4) is provided in the cleaning gas supply part 32b and the second reaction gas supply part 32c, respectively. The gas discharge holes 36 and 37 of the cleaning gas supply part 32b and the second reaction gas supply part 32c are provided in a plurality of circumferential directions of the susceptor 2 as well as in the radial direction of the susceptor 2, as necessary.

As illustrated in FIGS. 2 and 3, a region below the reaction gas nozzle 31 is a first process region P1 in which the first reaction gas adsorbs on the wafers W. A region below the showerhead 32 is a second process region P2 in which the second reaction gas reactable with the first reaction gas adsorbed on the wafer W is supplied, thereby depositing a molecular layer of a reaction product. The molecular layer of the reaction product constitutes a thin film to be deposited. In depositing the thin film, the second reaction gas is supplied from the second reaction gas supply part 32c, and no gas is supplied from the cleaning gas supply part 32b, or an inert gas is supplied from the cleaning gas supply part 32b as needed. A region below the reaction gas nozzle 33 is a third process region P3 in which the treatment gas converted to plasma or radicals is supplied to the reaction product produced in the second process region P2, thereby modifying the thin film deposited on the wafer W.

A plasma generator 80 is provided around the third processing region P3, for example, above or laterally to the third process region P3, as necessary. In FIG. 3, the plasma generator 80 is shown by being simplified with dashed lines. Providing the plasma generator 80 is not required and may be provided as needed. When the plasma generator 80 is provided, the plasma modifies the molecular layer of the thin film deposited on the wafer W in the second process region P2. Although the plasma generator 80 may be formed as any type of plasma generator, the plasma generator 80 may be formed as, for example, an ICP (Inductively-Coupled Plasma, inductively coupled) plasma generator. The details of the plasma generator 80 will be described later.

As the first reaction gas supplied from the reaction gas nozzle 31, when a silicon-containing film is deposited, a silicon-containing gas is selected, and when a metal-containing film is deposited, a metal-containing gas is selected. The silicon-containing films are typically silicon oxide films ($SiO_2$) or silicon nitride films (SiN), and the metal-containing films are oxide films or nitride films containing metals. For example, when the metal is titanium (Ti), the oxide film is titanium dioxide ($TiO_2$) and the nitride film is titanium nitride (TiN).

As the second reaction gas supplied from the second reaction gas supply part 32c, when the oxide film is deposited, for example, $O_3$, $O_2$, $H_2O$, and $H_2O_2$ are selected, and when the nitride film is deposited, for example, $NH_3$ is selected.

As the treatment gas supplied from the reaction gas nozzle 33, when the oxide film is modified, for example, a plasma treatment gas containing $O_2$ is selected. When the nitride film is modified, for example, a plasma treatment gas containing $NH_3$ or $N_2$ is selected. The plasma treatment gas may contain gases other than oxygen or nitrogen, such as Ar, $H_2$, and the like.

As the cleaning gas supplied from the cleaning gas supply part 32b, an etching gas capable of removing the thin film deposited on the surface of the susceptor 2, for example, a fluorine-containing gas such as $ClF_3$, is selected.

Referring to FIGS. 2 and 3, two convex portions 4 are provided in the vacuum chamber 1. The convex portion 4 is mounted on the back surface of the top plate 11 so as to protrude toward the susceptor 2, as described below, in order to form the separation region D with the separation gas nozzles 41 and 42. The convex portion 4 also has a fan-like shape with the top cut in an arc in a planar view, wherein the inner circular arc is connected to the protruding portion 5 (described below) and the outer circular arc is arranged along the inner circumferential surface of the chamber body 12 of the vacuum chamber 1.

Figure 4:
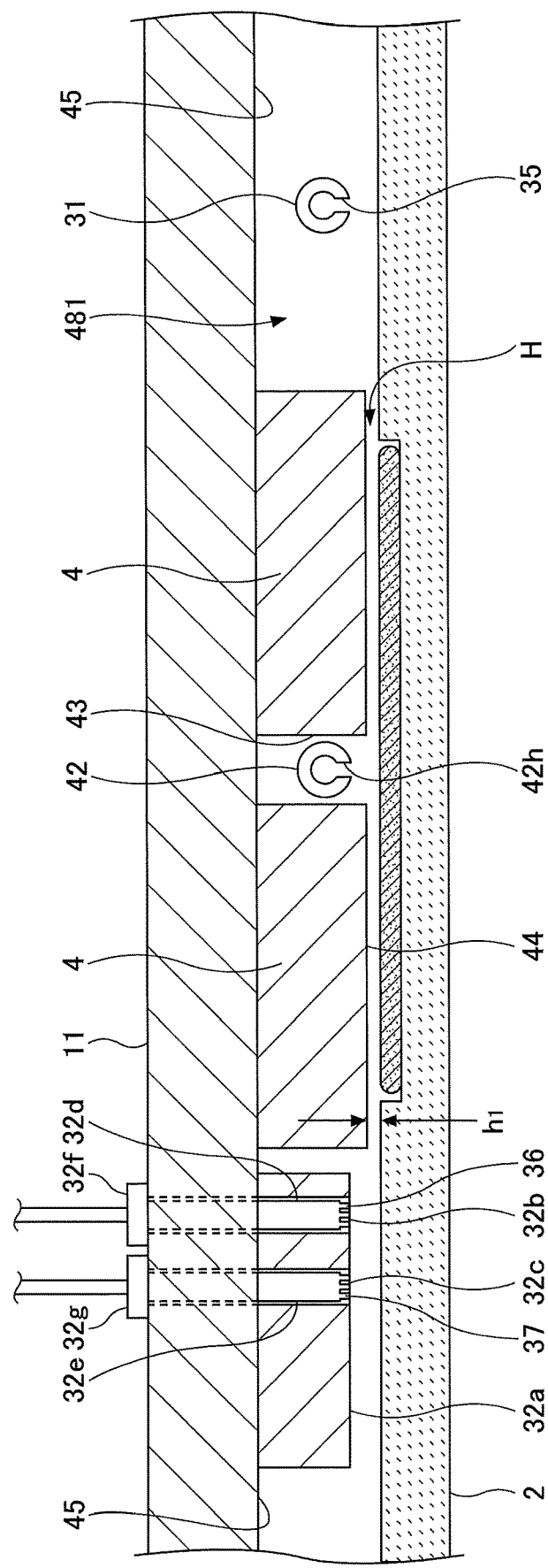
FIG. 4 is a cross-sectional view of a vacuum chamber along a concentric circle of a susceptor from a reaction gas nozzle to a showerhead.

FIG. 4 illustrates a cross section of the vacuum chamber 1 along a concentric circle of the susceptor 2 from the reaction gas nozzle 31 to the showerhead 32. As illustrated in FIG. 4, the convex portion 4 is fixed to the lower surface of the ceiling plate 11. Thus, the vacuum chamber 1 includes a flat low ceiling surface 44 (first ceiling surface) formed as the lower surface of the convex portion 4, and flat higher ceiling surfaces 45 (second ceiling surfaces) which are higher than the low ceiling surface 44 and formed on both sides of the low ceiling surface 44 in the circumferential direction. The low ceiling surface 44 has substantially a fan-like shape in a plan view where the apex is removed in an arc shape. Furthermore, as illustrated in the drawings, the convex portion 4 includes a groove portion 43 at a center in the circumferential direction. The groove portion 43 is formed to extend in the radial direction of the susceptor 2. The separation gas nozzle 42 is housed in the groove portion 43. Although not illustrated in FIG. 4, the separation gas nozzle 41 is also housed in a groove portion provided in the other convex portion 4. The reaction gas nozzle 31 and the showerhead 32 are provided in spaces below the high ceiling surfaces 45, respectively. The reaction gas nozzle 31 and the showerhead 32 are provided in the vicinity of the wafers W apart from the high ceiling surfaces 45, respectively. Here, the reaction gas nozzle 31 is provided in a space 481 below and on the right side of the high ceiling surface 45, and the showerhead 32 is provided in a space 482 below and on the left side of the high ceiling surface 45.

Each of the separation gas nozzles 41 and 42 has a plurality of gas discharge holes 42h (see FIG. 4) formed along the longitudinal direction thereof at a predetermined interval (10 mm, for example).

As described above, a plurality of gas discharge holes 35 are also provided on the lower surface of the reaction gas nozzle 31. The gas discharge holes 35 may be arranged at a predetermined distance along the lengthwise direction of the reaction gas nozzle 31 and may be arranged, for example, at a distance of 10 mm.

The bottom surface 32a of the showerhead 32 includes a cleaning gas supply part 32b for supplying the cleaning gas, and gas discharge holes 36 are provided in the cleaning gas supply part 32b. A second reaction gas supply part 32c is disposed downstream of the cleaning gas supply part 32b, and gas discharge holes 37 are disposed in the second reaction gas supply part 32c. The gas discharge holes 36 and 37 are not only provided in a plurality of radially arranged directions of the susceptor 2, but also are optionally arranged in a plurality of circumferential directions of the susceptor 2. In FIG. 4, an example of three gas discharge holes 36 and 37g arranged in a width direction (circumferential direction) is illustrated. The gas discharge holes 36 and 37 of the showerhead 32 may be configured to be smaller than the gas discharge hole 35 of the reaction gas nozzle 31 and the gas discharge hole 42h of the separation gas nozzle 42. This allows the gas to be supplied in a shower or spray form.

The cleaning gas supply part 32b is connected to a gas introduction part 32f through a gas inlet space 32d. The gas introduction part 32f is provided on the top plate 11 of the vacuum chamber 1 and a cleaning gas is introduced into the vacuum chamber 1 from the top surface of the vacuum chamber 1. Similarly, the second reaction gas supply part 32c is connected to a gas inlet 32g via a gas inlet space 32e. The gas inlet 32g is provided on the top plate 11 of the vacuum chamber 1 and a second reaction gas is introduced into the vacuum chamber 1 from the top surface of the vacuum chamber 1. Thus, a second reaction gas supply system is provided separately from the supply system of the cleaning gas, and the cleaning gas and the second reaction gas can be supplied independently of each other.

As shown in FIGS. 2 to 4, the cleaning gas supply part 32b is preferably disposed upstream of the second reaction gas supply portion 32c in the rotational direction of the susceptor 2. In dry cleaning, it is preferable to remove not only the reaction product on the susceptor 2, but also the reaction product attached to the bottom surface 32a of showerhead 32. By supplying the cleaning gas from the most upstream side while rotating the susceptor 2 after forming a flow from the upstream side toward the downstream side in the rotational direction of the susceptor 2 due to the suction from the exhaust port 620 described below, the cleaning gas can be supplied to the entire second process region P2.

The showerhead 32 is placed at a height where the bottom surface 32a is equal to or slightly higher than the ceiling surface 44 of the convex portion 4. The bottom surface 32a of the showerhead 32 may be set to the same height as the ceiling surface 44 of the convex portion 4, or may be set slightly higher than the ceiling surface 44 so that the gas discharge holes 36 of the cleaning gas supply portion 32b and the gas discharge holes 37 of the second reaction gas supply portion 32c have the same height as the gas discharge holes 35 of the reaction gas nozzle 31 and the gas discharge holes 42h of the separation gas nozzle 42. Further, the height of the bottom surface 32a of the showerhead 32 may be set to a different height from the ceiling surface 44, the gas discharge holes 35 and 42h, while taking into account the reactivity of the second reaction gas, the effect of dry cleaning and the like.

The low ceiling surface 44 provides a separation space H, which is a narrow space, with respect to the susceptor 2. When Ar gas is supplied from the separation gas nozzle 42 to the separation space H, this Ar gas flows toward the space 481 and the space 482 through the separation space H. On this occasion, because the volume of the separation space H is smaller than those of the spaces 481 and 482, the pressure in the separation space H can be made higher than those in the spaces 481 and 482 by Ar gas. It means that the separation space H having the higher pressure is formed between the spaces 481 and 482. Moreover, Ar gas flowing from the separation space H toward the spaces 481 and 482 serves as a counter flow against the first reaction gas from the gas first process region P1 and the second reaction gas from the second process region P2. Thus, the first reaction gas from the first process region P1 is separated from the second reaction gas from the second process region P2 by the separation space H. Therefore, mixing and reacting of the first reaction gas with the second reaction gas are prevented in the vacuum chamber 1.

The height h1 of the low ceiling surface 44 above the upper surface of the susceptor 2 is preferred to be appropriately determined based on the pressure of the vacuum chamber 1 during the film deposition, the rotational speed of the susceptor 2, and a supplying amount of the separation gas (Ar gas) in order to maintain the pressure in the separation space H higher than those in the spaces 481 and 482.

Referring to FIGS. 1 through 3, the ceiling plate 11 further includes the protruding portion 5 at its lower surface to surround the outer periphery of the core unit 21 that supports the susceptor 2. The protruding portion 5 is continuously formed with the inner portions of the convex portions 4 and has a lower surface that is formed at the same height as those of the low ceiling surfaces 44, in this embodiment.

Figure 5:
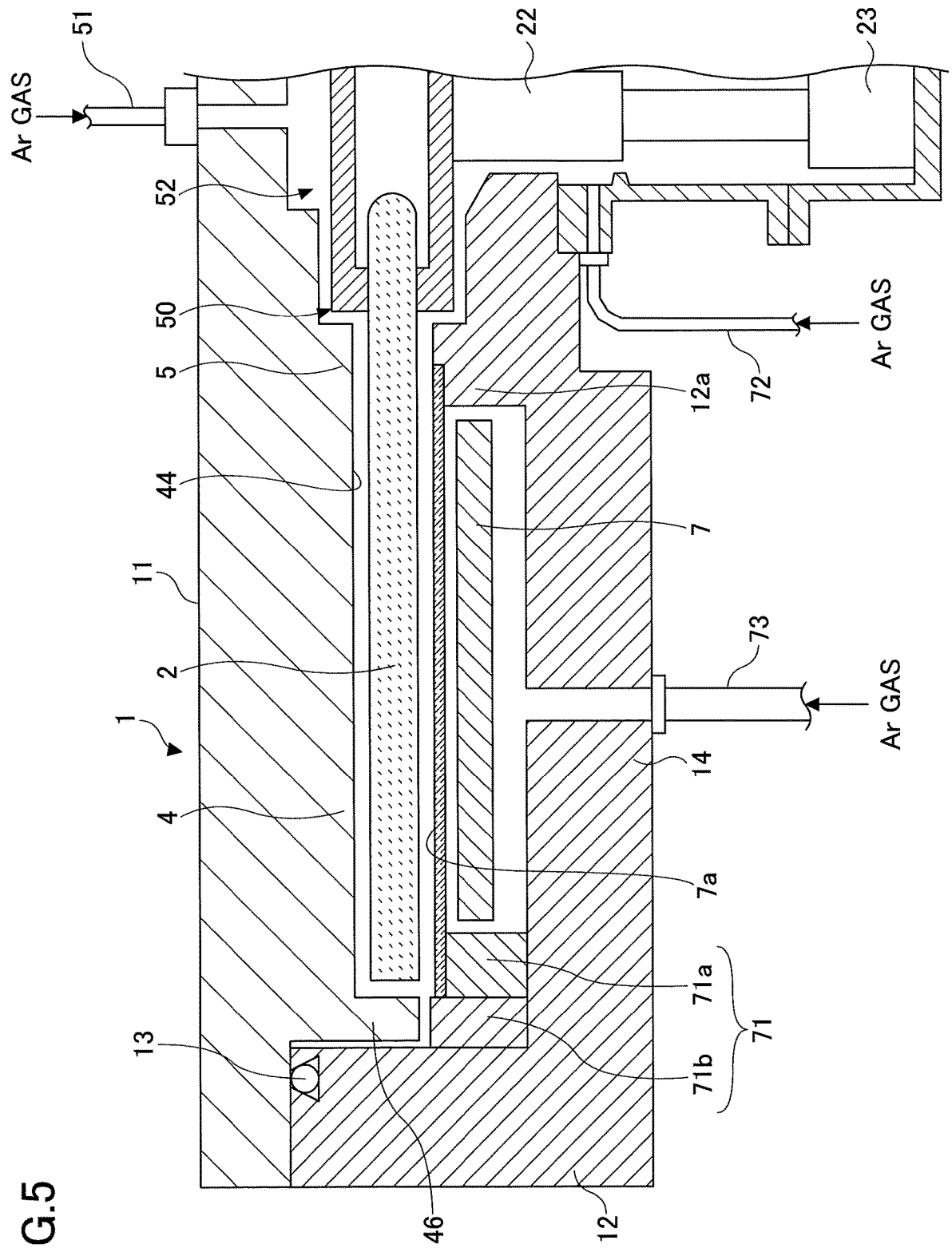
FIG. 5 is a cross-sectional view of a substrate processing apparatus according to an embodiment of the present disclosure.

FIG. 5 is a partial cross-sectional view illustrating a region where the ceiling surface 44 is provided. FIG. 1, referred to above, illustrates a cross-sectional view of the region in which the ceiling surface 45 is provided. Meanwhile, FIG. 5 illustrates a cross-sectional view illustrating a region in which a ceiling surface 44 is provided. As illustrated in FIG. 5, the convex portion 4 having a substantially fan-like shape in plan view includes an outer bending portion 46 at its outer peripheral end portion (at an outer peripheral end portion side of the vacuum chamber 1) which is bent to have an L-shape to face an outer end surface of the susceptor 2. The outer bending portion 46 inhibits a flow of gas between the space 481 and the space 482 through the space between the susceptor 2 and the inner peripheral surface of the chamber body 12. As described above, the convex portions 4 are provided on the ceiling plate 11 which is detachably attached to the chamber body 12. Thus, a slight space is provided between the outer periphery surface of the outer bending portion 46 and the chamber body 12. The spaces between the inner periphery surface of the outer bending portion 46 and an outer surface of the susceptor 2, and the space between the outer periphery surface of the outer bending portion 46 and the chamber body 12 are set at the same size as the height h1 (see FIG. 4) of the low ceiling surface 44 with respect to the upper surface of the susceptor 2, for example.

As illustrated in FIG. 5, the inner peripheral wall of the chamber body 12 is provided to extend in a vertical direction to be closer to the outer peripheral surface of the outer bending portion 46 at the separation region H. However, other than the separation region H, as illustrated in FIG. 1, for example, the inner peripheral wall of the chamber body 12 recesses outward in a range from a location facing the outer end surface of the susceptor 2 to the upper end of the bottom portion 14. Hereinafter, for an explanatory purpose, the concave portion, having a substantially rectangular cross-sectional view, is referred to as an "evacuation region." Specifically, a part of the evacuation region which is in communication with the first process region P1 is referred to as a first evacuation region E1, and a part of the evacuation region which is in communication with the second and third process regions P2 and P3 is referred to as a second evacuation region E2. As illustrated in FIGS. 1 through 3, a first evacuation port 610 and a second evacuation port 620 are respectively provided at the bottom portions of the first evacuation region E1 and the second evacuation region E2. The first evacuation port 610 and the second evacuation port 620 are connected to vacuum pumps 640, which are vacuum evacuation units, via evacuation pipes 630, respectively, as illustrated in FIG. 1. Moreover, a pressure controller 650 is provided between the vacuum pumps 640 and the evacuation pipes 630 in FIG. 1.

As illustrated in FIGS. 1 and 5, a heater unit 7, which is a heating device, is provided in a space between the bottom portion 14 of the vacuum chamber 1 and the susceptor 2, and heats a wafer W on the susceptor 2 via the susceptor 2 up to a temperature determined by a process recipe (e.g., 400° C.). As illustrated in FIG. 5, a ring-shaped cover member 71 is provided below, at and near the periphery of the susceptor 2 to prevent a gas from entering an area under the susceptor 2 by separating an atmosphere from a space above the susceptor 2 to the evacuation regions E1 and E2 from an atmosphere in which the heater unit 7 is placed. The cover member 71 includes an inner member 71a provided under the periphery and outside of the susceptor 2 and an outer member 71b provided between the inner member 71a and the inner side wall of the vacuum chamber 1. The outer member 71b is provided to face the outer bending portion 46, which is formed at an outer edge portion at lower side of each of the convex portions 4. The inner member 71a is provided to surround the entirety of the heater unit 7 below the outer end portion (and at a slightly outer side of the outer edge portion) of the susceptor 2.

The bottom portion 14 of the vacuum chamber 1 closer to the rotation center than the space where the heater unit 7 is provided protrudes upward to be close to the core unit 21 to form a projecting portion 12a. A narrow space is provided between the projecting portion 12a and the core unit 21. Furthermore, a narrow space is provided between an inner peripheral surface of the bottom portion 14 and the rotary shaft 22 to be in communication with the case body 20. A purge gas supplying pipe 72 which supplies Ar gas as the purge gas to the narrow space for purging is provided in the case body 20. The bottom portion 14 of the vacuum chamber 1 includes a plurality of purge gas supplying pipes 73 (only one of the purge gas supplying pipes 73 is illustrated in FIG. 5) which are provided at a predetermined angle interval in the circumferential direction below the heater unit 7 for purging the space where the heater unit 7 is provided. Moreover, a cover member 7a is provided between the heater unit 7 and the susceptor 2 to prevent the gas from going into the space where the heater unit 7 is provided. The cover member 7a is provided to extend from an inner peripheral wall (upper surface of the inner member 71a) of the outer member 71b to an upper end portion of the projecting portion 12a in the circumferential direction. The cover member 7a may be made of quartz, for example.

The film deposition apparatus 1 further includes a separation gas supplying pipe 51 that is connected to a center portion of the ceiling plate 11 of the vacuum chamber 1 and is provided to supply Ar gas as the separation gas to a space 52 between the ceiling plate 11 and the core unit 21. The separation gas supplied to the space 52 flows through a narrow space between the protruding portion 5 and the susceptor 2 so as to flow along the top surface of the susceptor 2 where the wafers W are to be placed and is discharged toward the outer periphery. The space 50 is kept at a pressure higher than those of the space 481 and the space 482 by the separation gas. Thus, the mixing of the first reaction gas supplied to the first process region P1 and the second reaction gas supplied to the second process region P2 by flowing through the center area C can be prevented by the space 50. It means that the space 50 (or the center area C) can function similarly to the separation space H (or the separation region D).

In addition, as illustrated in FIGS. 2 and 3, a transfer port 15 is formed in a side wall of the vacuum chamber 1 for allowing the wafers W, which are substrates, to pass between an external transfer arm 10 and the susceptor 2. The transfer port 15 is opened and closed by a gate valve (not illustrated in the drawings). Furthermore, lift pins, which penetrate through the recess 24 to lift up the wafer W from a backside surface, and a lifting mechanism for the lift pins (both are not illustrated in the drawings) are provided at a location where the wafer W is transferred and below the susceptor 2 because the wafer W is transferred between the external transfer arm 10 and the recess 24 of the susceptor 2, which is a substrate receiving area, at a location facing the transfer port 15.

Next, an exemplary configuration of the showerhead 32 is described below in more detail.

Figure 6:
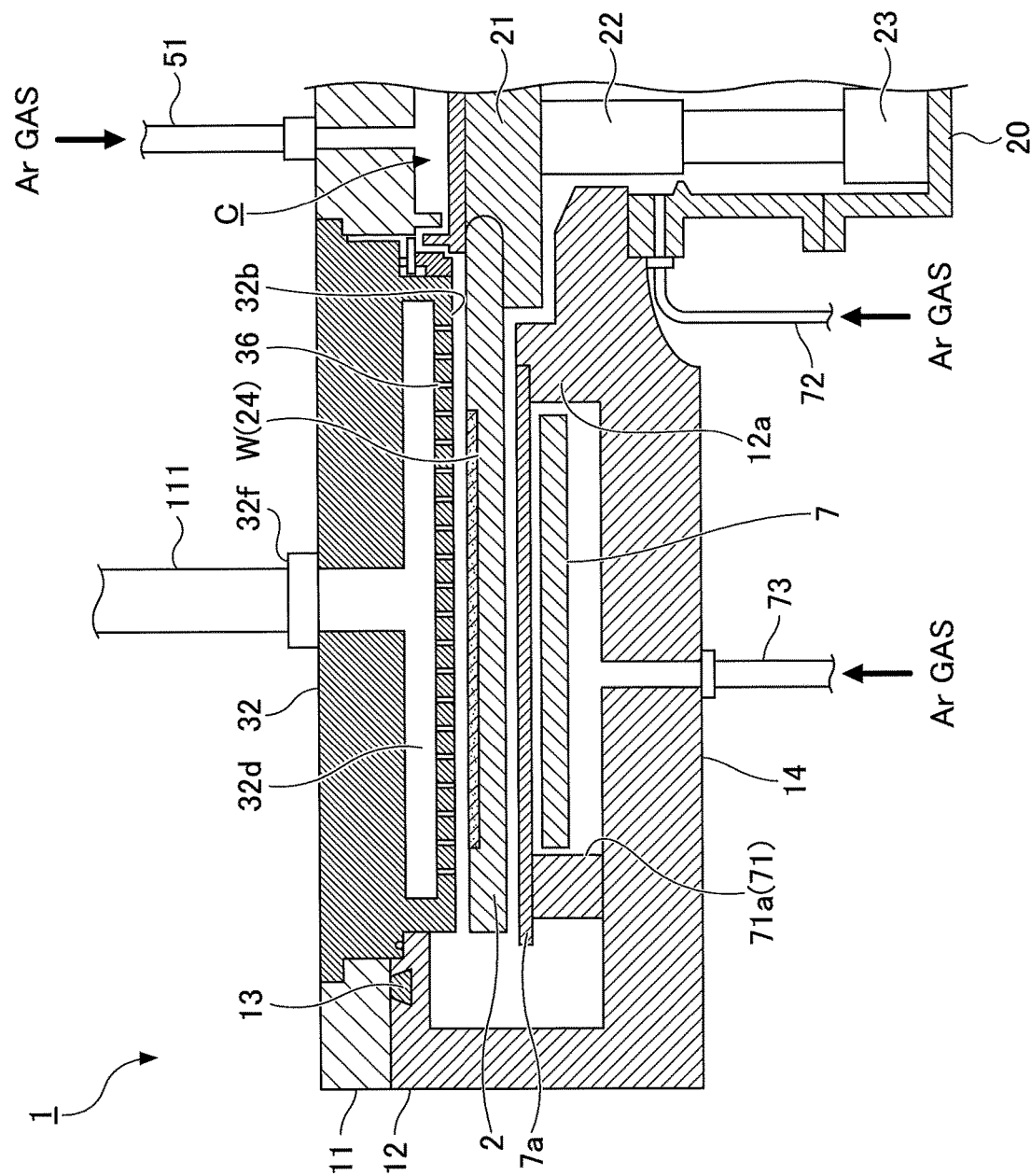
FIG. 6 is a cross-sectional view illustrating an example of a cleaning gas supply part of a showerhead of a substrate processing apparatus according to an embodiment of the present disclosure.

FIG. 6 is a cross-sectional view illustrating an example of a cleaning gas supply part 32b of a showerhead 32 of a substrate processing apparatus according to this embodiment. As illustrated in FIG. 6, the showerhead 32 communicates with the gas discharge holes 36 of the cleaning gas supply part 32b in the gas introduction space 32d, and the gas introduction space 32d is connected to the gas introduction part 32f. The gas introduction part 32f is connected to the cleaning gas supply 131 via a pipe 111 and a flow controller 121 (see FIG. 3). The gas discharge holes 36 of the cleaning gas supply part 32b are provided in a plurality of directions along the radial direction of the susceptor 2. For example, the cleaning gas supply part 32b of the showerhead 32 may have such a configuration.

The second reaction gas supply part 32c may be configured in the same manner as the cleaning gas supply part 32b. The second reaction gas supply part 32c connects the gas introduction part 32g to the second reaction gas supply source 132 through a pipe 112 and a flow controller 122 (see FIG. 3).

Figure 7:
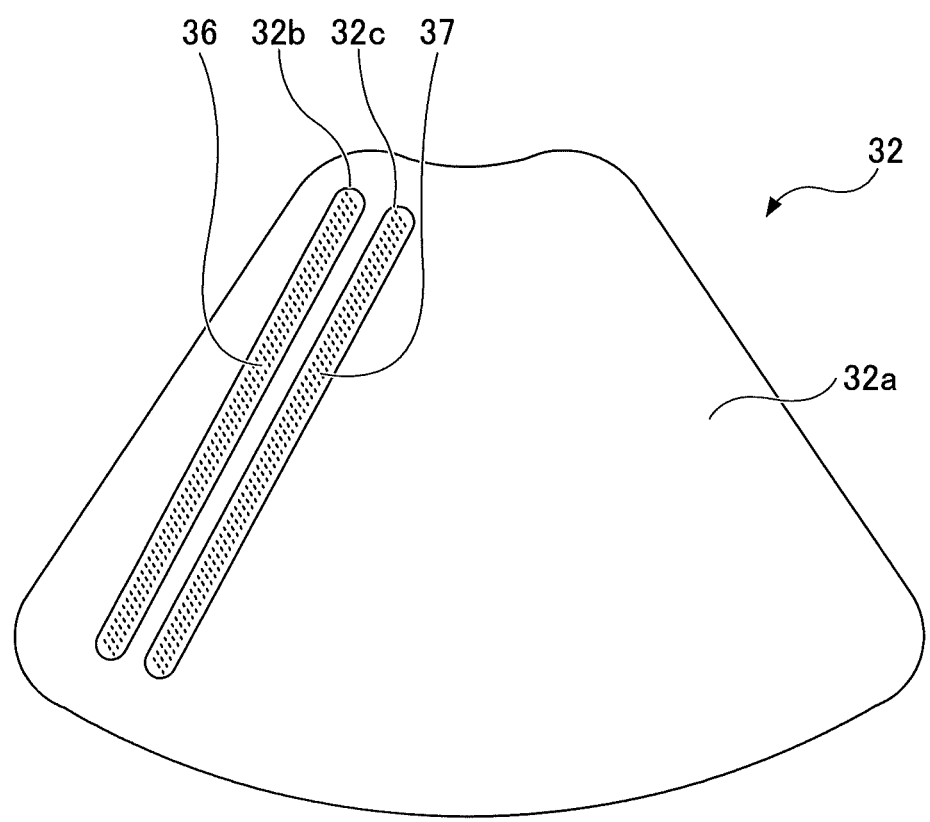
FIG. 7 is a plan view illustrating an example of a bottom surface of a showerhead.

FIG. 7 is a plan view illustrating an example of a bottom surface 32a of a showerhead 32. The cleaning gas supply part 32b and the second reaction gas supply part 32c may have the plurality of gas discharge holes 36 and 37 so that the number of gas discharge holes 36 and 37 decreases toward the center of rotation and increases toward the outer periphery depending on the difference in the moving speed between the center and the outer periphery of the susceptor 2. The number of gas discharge holes 36 and 37 can be, for example, tens to hundreds. The diameter of the gas discharge holes 36 and 37 may be, for example, from 0.5 mm to 3 mm. The gases supplied to the cleaning gas supply part 32b and the second reaction gas supply part 32c of the showerhead 32 are discharged to the space between the susceptor 2 and the bottom surface 32a of the showerhead 32 through the gas discharge holes 36 and 37, respectively.

Next, a plasma generator 80 that is provided as needed is described below.

Figure 8:
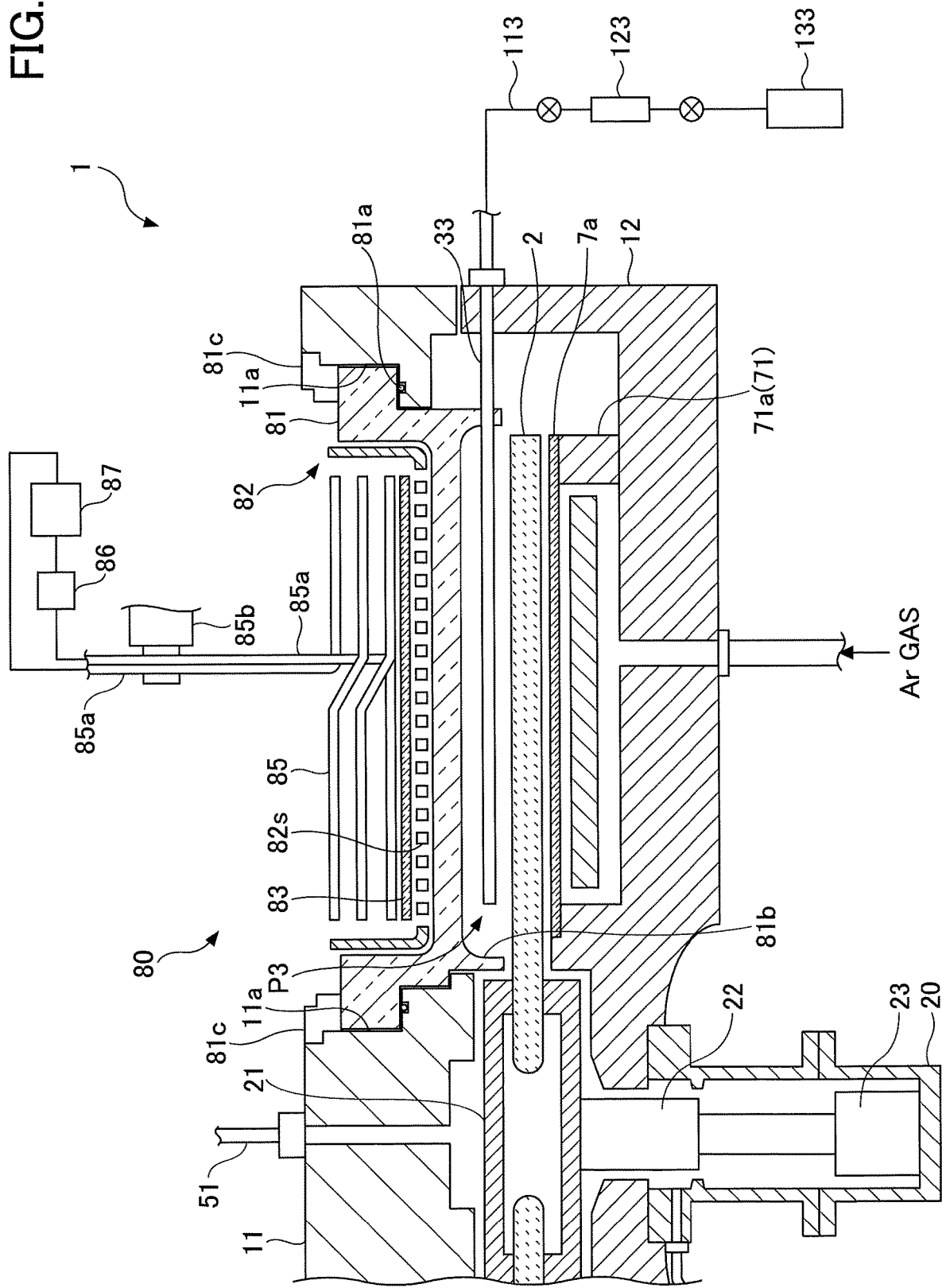
FIG. 8 is a schematic cross-sectional view of a plasma generator along a radial direction of a susceptor.
Figure 9:
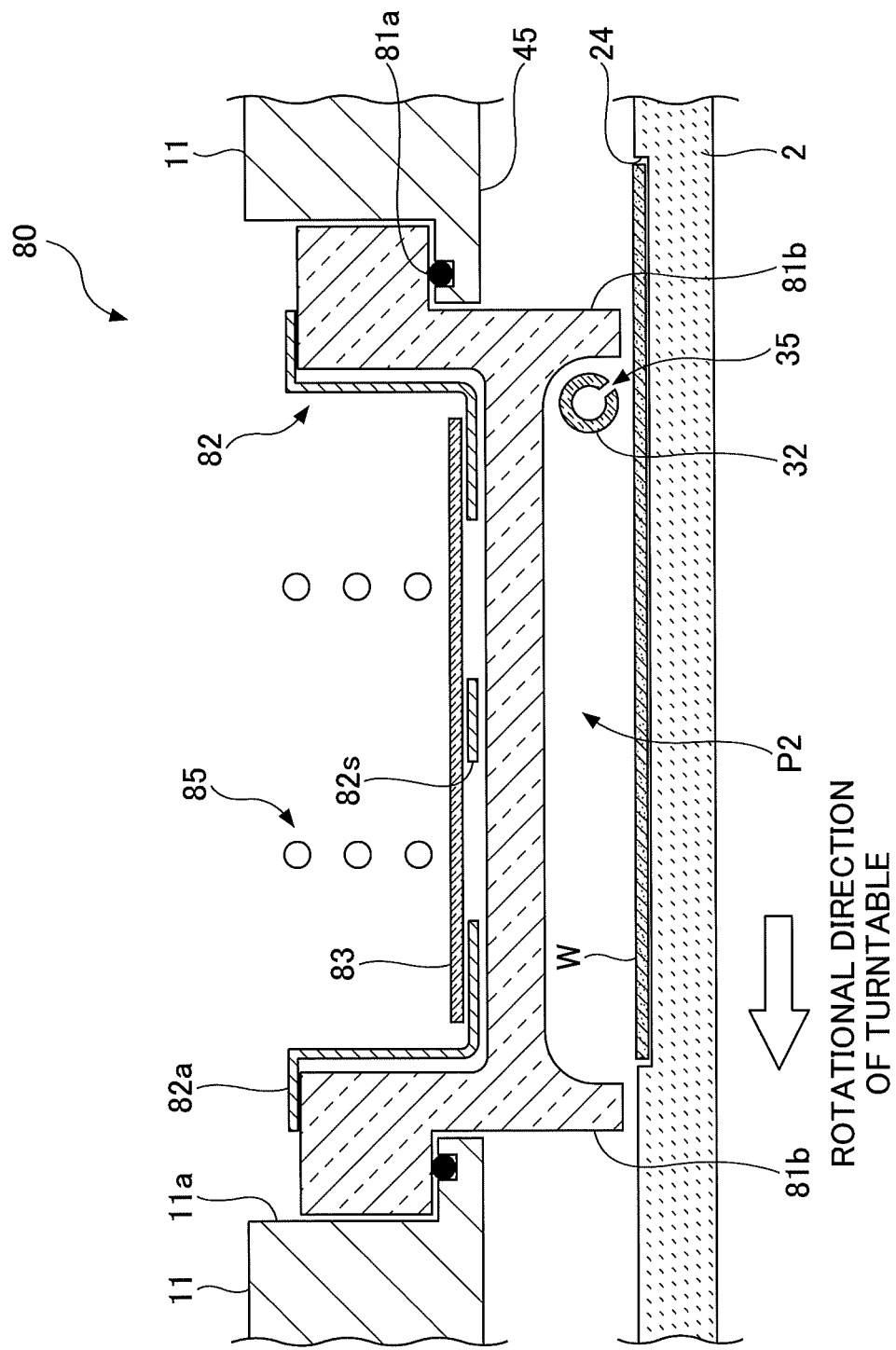
FIG. 9 is a schematic cross-sectional view of a plasma generator along a direction perpendicular to a radial direction of a susceptor.
Figure 10:
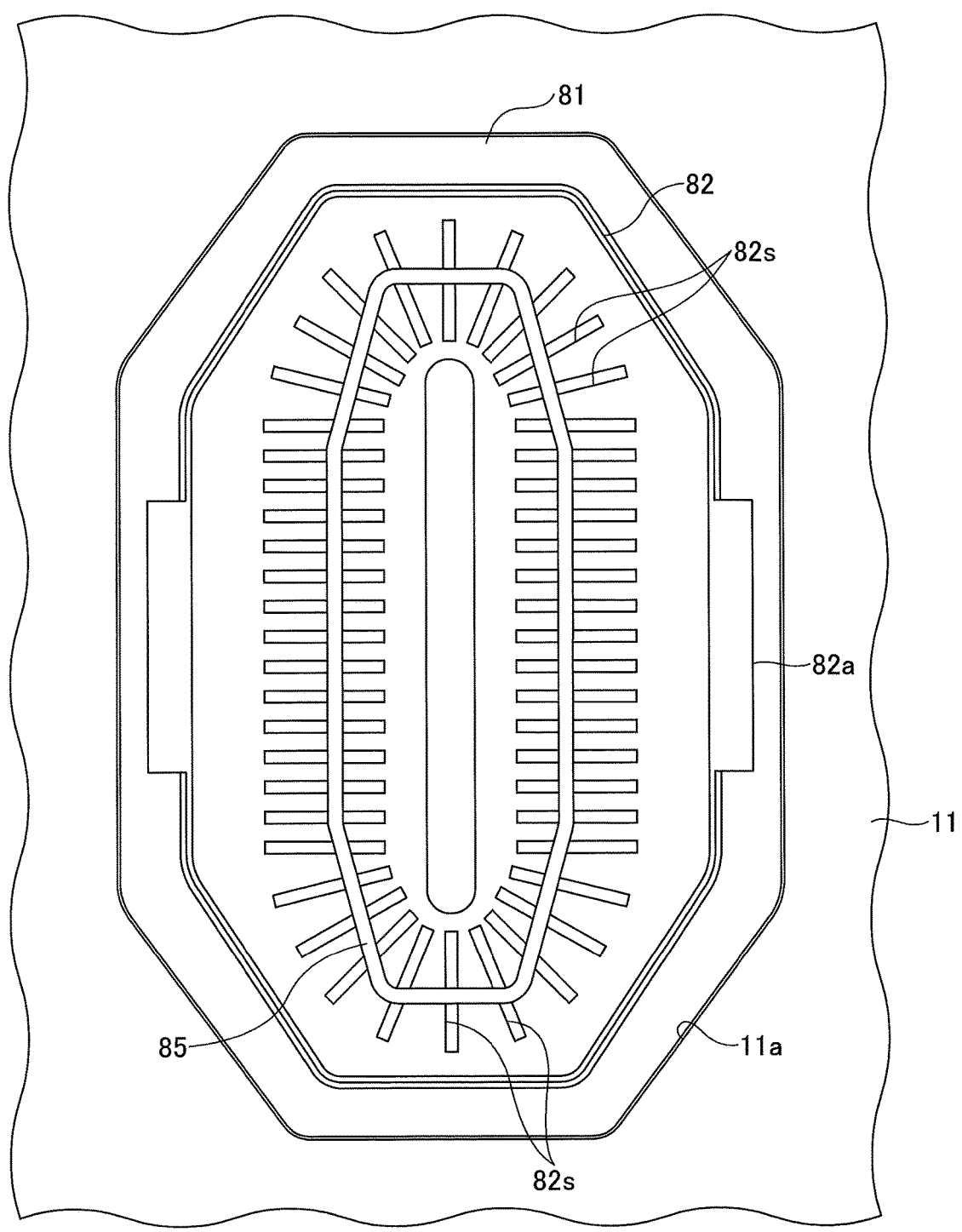
FIG. 10 is a schematic top view illustrating a plasma generator.

FIG. 8 is a schematic cross-sectional view of a plasma generator 80 along a radial direction of the susceptor 2. FIG. 9 is a schematic cross-sectional view of the plasma generator 80 along a direction perpendicular to the radial direction of the susceptor 2. FIG. 10 is a top view schematically illustrating the plasma generator 80. For the convenience of illustration, some members are simplified in these figures.

Referring to FIG. 8, the plasma generator 80 is made of a material that transmits radio frequency waves, and has a concave portion in its upper surface. The plasma generator 80 further includes a frame member 81 that is embedded in an opening 11a provided in the ceiling plate 11, a Faraday shield plate 82 housed in the concave portion of the frame member 81 and having substantially a box shape whose top is opened, an insulating plate 83 placed on a bottom surface of the Faraday shield plate 82, and a coil antenna 85 supported by the insulating plate 83 thereon. The antenna 85 has substantially an octagonal shape in a plan view.

The opening 11a of the ceiling plate 11 is formed to have a plurality of step portions, and one of the step portions has a groove portion to extend along the perimeter where a sealing member 81a such as an O-ring or the like is embedded. The frame member 81 is formed to have a plurality of step portions that correspond to the step portions of the opening 11a, and when the frame member 81 is engaged in the opening 11a, a back side surface of one of the step portions contacts the sealing member 81a embedded in the opening 11a so that the ceiling plate 11 and the frame member 81 are kept in an air-tight manner. Moreover, as illustrated in FIG. 6, a pushing member 81c, which extends along the outer periphery of the frame member 81 that is fitted in the opening 11a of the ceiling plate 11, is provided so that the frame member 81 is pushed downward with respect to the ceiling plate 11. Thus, the ceiling plate 11 and the frame member 81 are further kept in an air-tight manner.

The lower surface of the frame member 81 is positioned to face the susceptor 2 in the vacuum chamber 1, and a projection portion 81b that projects downward (toward the susceptor 2) is provided at the perimeter at the lower surface. The lower surface of the projection portion 81b is close to the surface of the susceptor 2, and a space (hereinafter referred to as the third process region P3) is surrounded by the projection portion 81*b*, the surface of the susceptor 2 and the lower surface of the frame member 81 above the susceptor 2. The distance between the lower surface of the projection portion 81*b* and the surface of the susceptor 2 may be the same as the height h1 between the ceiling surface 44 and the upper surface of the susceptor 2 in the separation space H (FIG. 4).

Further, the reaction gas nozzle 33 penetrating through the protruded portion 81*b* extends in the third process region P3. In the present embodiment, a treatment gas source 133 filled with the treatment gas is connected to the reaction gas nozzle 33 by a pipe 113 via a flow controller 123, as shown in FIG. 8. The treatment gas may be, for example, a gas containing oxygen ($O_2$) when the thin film to be deposited is an oxide, for example, oxygen and argon, or a mixture of oxygen, argon and hydrogen. When the thin film to be deposited is a nitride film, the treatment gas may be a gas containing ammonia ($NH_3$), in particular a mixture of ammonia and argon, or a mixture of ammonia, argon and nitrogen. The treatment gas, whose flow rate is controlled by the flow controller 123, is activated by the plasma generator 80 and supplied to the third process region P3 at a predetermined flow rate. For example, when a mixture of oxygen and argon is used as an oxidation treatment gas, oxygen and argon may be supplied separately, but FIG. 8 illustrates a configuration of supplying a mixed gas to the reaction gas nozzle 33 for convenience of illustration.

A plurality of gas discharge holes 35 are formed in the reaction gas nozzle 33 at a predetermined interval (e.g., 10 mm) along the longitudinal direction thereof, and the treatment gas is discharged from the gas discharge holes 35. The gas discharge holes 35 are inclined from a direction perpendicular to the susceptor 2 toward an upstream direction of rotation of the susceptor 2, as illustrated in FIG. 9. Accordingly, the treatment gas supplied by the reaction gas nozzle 33 is discharged in the direction opposite to the rotational direction of the susceptor 2, in particular, toward a gap between the lower surface of the protruded portion 81*b* and the surface of the susceptor 2. This prevents the reaction gas or separation gas from flowing into the third processing region P3 from the space below the ceiling surface 45 located upstream of the plasma generator 80 along the rotational direction of the susceptor 2. Also, as described above, since the protrusion portion 81*b* formed along the outer periphery of the lower surface of the frame member 81 is proximate to the surface of the susceptor 2, the pressure in the third process region P3 can be easily maintained by a gas from the reaction gas nozzle 33. This also prevents the reaction and the separation gases from flowing into the third process region P3.

Thus, as shown in FIGS. 2 and 3, the separation space H is not provided between the second process region P2 and the third process region P3. However, even when the cleaning gas is supplied from the cleaning gas supply portion 32*b* of the showerhead 32 due to the presence of the frame member 81, the cleaning gas cannot reach the third process region P3. However, in the cleaning process, because the susceptor 2 is rotated, even if the cleaning gas supplied from the cleaning gas supply part 32*b* does not reach the third process region P3, the cleaning gas can be supplied to the entire surface of the susceptor 2.

The Faraday shield plate 82 is made of a conductive material such as a metal and is grounded, although not illustrated in the drawings. As clearly illustrated in FIG. 8, the Faraday shield plate 82 has a plurality of slits 82*s* at its bottom portion. Each of the slits 82*s* extends substantially perpendicularly to a corresponding side of the antenna 85 that has the substantially octagonal planar shape.

As illustrated in FIGS. 9 and 10, the Faraday shield plate 82 includes two support portions 82*a* that are provided at upper end portions to bend outward. The support portions 82*a* are supported by the upper surface of the frame member 81 so that the Faraday shield plate 82 is supported at a predetermined position in the frame member 81.

The insulating plate 83 is made of fused quartz, for example, has a size slightly smaller than that of the bottom surface of the Faraday shield plate 82, and is mounted on the bottom surface of the Faraday shield plate 82. The insulating plate 83 insulates the Faraday shield plate 82 from the antenna 85 while passing the radio frequency waves radiated from the antenna 85 downward.

The antenna 85 is formed by winding a pipe made of copper three times, for example, in a substantially octagonal planar shape. Thus, cooling water can be circulated in the pipe, and the antenna 85 is prevented from being heated to a high temperature by the radio frequency waves supplied to the antenna 85. As illustrated in FIG. 6, the antenna 85 includes a standing portion 85*a* to which a support portion 85*b* is attached. The antenna 85 is maintained at a predetermined position in the Faraday shield plate 82 by the support portion 85*b*. The radio frequency power source 87 is connected to the support portion 85*b* via the matching box 86. The radio frequency power source 87 is capable of generating radio frequency power having a frequency of 13.56 MHz, for example.

According to the plasma generator 80 thus structured, when the radio frequency power source 87 supplies the radio frequency power to the antenna 85 via the matching box 86, the antenna 85 generates an electromagnetic field. In the electromagnetic field, the Faraday shield plate 82 cuts the electric field component so as not to transmit the electric field component downward. On the other hand, the magnetic field component is transmitted into the second process region P2 through the plurality of slits 82*s* of the Faraday shield plate 82. The magnetic field component activates the treatment gas supplied to the third process region P3 from the reaction gas nozzle 33 at a predetermined flow rate.

As illustrated in FIG. 1, the film deposition apparatus according to the present embodiment further includes a controller 100 that is constituted of a computer and controls the entirety of the film deposition apparatus. A memory in the controller 100 stores a program by which the film deposition apparatus executes the film deposition method (as will be described below) under a control of the control unit 100. The program is formed to include steps capable of executing the film deposition method, and is stored in a medium 102 such as a hard disk, a compact disc, a magneto-optic disk, a memory card, and a flexible disk. A predetermined reading device reads the program into a storage part 101, and the program is installed in the controller 100.

Furthermore, the controller 100 also performs control for executing a method for dry cleaning a susceptor according to the embodiment of the present disclosure, which will be described later.

[Method for Dry Cleaning Susceptor]

Next, a method for dry cleaning a susceptor according to an embodiment of the present disclosure is described below. Dry cleaning is performed when it is necessary to perform substrate processing using a substrate processing device and to remove a reaction product deposited on a susceptor 2. In other words, the reaction product deposited on the susceptor 2 reaches a predetermined amount, and if the substrate processing is continued without any change, the substrate processing may have a defect. Accordingly, dry cleaning of the susceptor 2 is performed after the substrate processing is completed and the wafer W is carried out of the vacuum chamber 1, and before the wafer W is carried into vacuum chamber 1. That is, the dry cleaning of the susceptor 2 is performed while the wafer W is not present in the vacuum chamber 1, and is performed at timing when the substrate processing is not performed. In the meantime, because the dry cleaning is performed due to a reaction product generated by the substrate processing, the method for dry cleaning the susceptor according to the embodiment of the present disclosure is described after the substrate processing is described. Further, with regard to the substrate processing and the dry cleaning, an example of performing film deposition to deposit a silicon oxide film and then performing dry cleaning to remove the silicon oxide film deposited on the susceptor 2 is cited and described below.

In addition, the substrate processing is described below by citing an example of performing a film deposition process using the substrate processing apparatus described above. Accordingly, the drawings referred to so far will be referred to as appropriate.

First, a gate valve (not illustrated in the drawings) is opened, and the transfer arm 10 (FIG. 3) transfers the wafer W from the outside to the recess 24 of the susceptor 2 via the transfer port 15 (FIG. 2 and FIG. 3). This transfer is performed by raising and lowering the lift pins (not illustrated in the drawings) via through holes provided in the bottom surface of the recess 24 from the bottom portion side of the vacuum chamber 1 when the recess 24 stops at a position facing the transfer port 15. By repeating such a wafer transfer while intermittently rotating the susceptor 2, the wafers W are loaded into the respective recesses 24.

Then, the gate valve is closed, and the vacuum pump 640 evacuates the vacuum chamber 1 to the attainable degree of vacuum. Then, each of the separation gas nozzles 41 and 42 discharges Ar gas or $N_2$ gas as a separation gas at a predetermined flow rate. At this time, the separation gas supplying pipe 51 and the purge gas supplying pipes 72 and 73 also discharge Ar gas or $N_2$ gas at a predetermined flow rate, respectively. Along with this, the automatic pressure controllers 650 and 651 adjust the inside of the vacuum vessel 1 to the preset processing pressure, and set the exhaust pressure so that the first exhaust port 610 and the second exhaust port 620 have the appropriate differential pressure. As described above, an appropriate pressure difference is set depending on the set pressure in vacuum vessel 1.

Then, the heater unit 7 heats the wafers W to 400° C., for example, while the susceptor 2 is rotated in a clockwise direction at a rotational speed of 10 rpm, for example.

Subsequently, the reaction gas nozzle 31 discharges a Si-containing gas, and the showerhead 32 discharges an oxidation gas such as $O_3$ from the second reaction gas supply part 32c. The Si-containing gas is not limited to a particular gas, and various Si-containing gases can be used depending on the intended purpose. For example, the Si-containing gas may be an organic aminosilane gas such as 3DMAS (tris (dimethylamino)silane and Tris(dimethylamino)silane). The oxidation gas is not particularly limited, and various oxidation gases can be used depending on the intended purpose, such as $O_2$, $H_2O$, $H_2O_2$ and the like, in addition to $O_3$.

When a plasma treatment is performed, a treatment gas (plasma treatment gas) mixed at a predetermined flow rate ratio is supplied from the reaction gas nozzle 33. For example, a mixture of Ar gas, $O_2$ gas and $H_2$ gas is supplied into the vacuum chamber 1 to supply high frequency power, for example, 700 W, from a high frequency power source to the antenna 85 of the plasma generator 80. Thus, oxygen plasma is generated, and modifies the deposited silicon oxide film.

Here, while the susceptor 2 rotates, a silicon oxide film is deposited on the wafer W as follows. That is, when the wafer W first passes through the first process region P1 below the reaction gas nozzle 31, a Si-containing gas adsorbs on the surface of the wafer W. Next, as the wafer W passes through the second process region P2 below the showerhead 32, $O_3$ gas from the showerhead 32 oxidizes the Si-containing gas on the wafer W to form a single layer (or a few molecular layers) of silicon oxide.

When the wafer W passes through a third process region P3 below the plasma generator 80, the silicon oxide layer on the wafer W is then exposed to an activated gas containing oxygen radicals. Active oxygen species, such as oxygen radicals, serves to release, for example, an organic matter contained in the Si-containing gas and remaining in the silicon oxide layer from the silicon oxide layer, by oxidizing the organic matter remaining in the silicon oxide layer. This makes it possible to purify the silicon oxide layer.

After rotating the susceptor 2 as many times as the silicon oxide film having the desired film thickness is deposited, the film deposition process is terminated by stopping the supply of a mixture of Si-containing gas, $O_3$ gas, and a gas for plasma processing containing Ar gas and $O_2$ gas as needed. Subsequently, the supply of Ar gas from the separation gas nozzles 41 and 42, the separation gas supply pipe 51, and the purge gas supply pipes 72 and 73 is also stopped and the rotation of the susceptor 2 is stopped. Subsequently, the wafers W are carried out of the vacuum chamber 1 by the procedure reversed to the procedure for carrying the wafer W into the vacuum chamber 1.

After the wafer W is removed from the vacuum chamber 1, a new wafer W is carried into the vacuum chamber 1 and the deposition process is performed again. By repeating such a deposition process, a silicon oxide film is gradually deposited on the surface of susceptor 2. When the silicon oxide film deposited on the surface of susceptor 2 peels off, the peeled silicon oxide film becomes a particle and worsens the quality of the deposition process.

Accordingly, when the silicon oxide film deposited on the surface of susceptor 2 reaches a predetermined film thickness, or after a predetermined number of deposition processes, dry cleaning is performed to remove the silicon oxide film on the susceptor 2. The dry cleaning is performed as described above when there is no wafer W in the vacuum chamber 1. Specifically, the cleaning gas is supplied from the cleaning gas supply part 32b of the showerhead 32 while rotating the susceptor 2. A gas capable of removing the silicon oxide film by etching is selected as the cleaning gas is selected, and for example, a fluorine-containing gas such as $ClF_3$ is used.

A cleaning gas nozzle (not illustrated) is also provided in the first process region P1 to supply the cleaning gas throughout the surface of the susceptor 2 and to clean the surface of the susceptor 2. Such dry cleaning etches the silicon oxide film on the surface of the susceptor 2 and cleans the susceptor 2.

However, mere cleaning may cause a region where the cleaning gas is locally difficult to reach and the etching is inadequate. For example, when substrate processing is performed by the substrate processing apparatus described above and dry cleaning is performed, etching on the rotational center side and the outer peripheral side of the susceptor 2 may become insufficient.

In this case, the method for dry cleaning the susceptor according to the present embodiment performs the dry cleaning in two stages.

Figure 11:
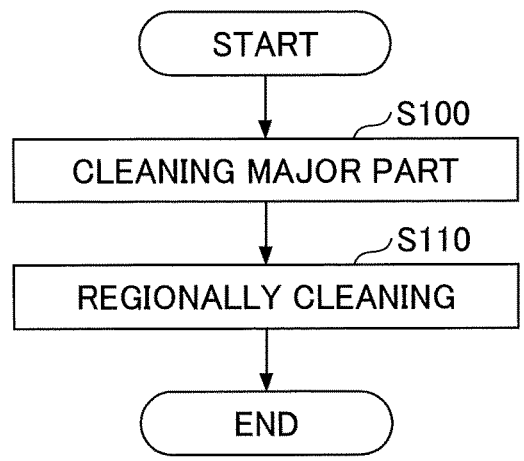
FIG. 11 is a processing flow diagram of a method for dry cleaning a susceptor according to an embodiment of the present invention.

FIG. 11 is a process flowchart of a method for dry cleaning a susceptor according to an embodiment of the present invention.

In FIG. 11, a first cleaning process is performed in step S100 to completely clean a main part of the susceptor 2. Here, the main part of the susceptor 2 means a main region including a recess 24 that is a substrate receiving region. That is, the cleaning gas supply part 32b of the showerhead 32 simply supplies the gas for dry cleaning. At this time, no gas is supplied from the second reaction gas supply part 32c, or an inert gas is supplied at a small flow rate. Thus, the cleaning gas supplied from the cleaning gas supply part 32b flows through most part of the second process region P2, and the silicon oxide film is removed from the main part of the susceptor 2. As described in FIGS. 2, 3, 6 and 7, the cleaning gas supply part 32b of the showerhead 32 covers the entire radial length or radius of the susceptor 2, so that cleaning gas is supplied to the entire portion including the recess 24.

However, as described above, the cleaning gas is difficult to reach regions near the radial ends of susceptor 2, that is, the central axis and the outer periphery of susceptor 2, thereby sometimes resulting in inadequate etching on the silicon oxide film.

Hence, in step S110 of FIG. 11, a second cleaning process is performed to perform local cleaning of the susceptor 2. In the local cleaning, the cleaning gas is supplied locally to an area where the removal of the silicon oxide film is insufficient in the first cleaning process. The local supply of cleaning gas may be controlled, by any means, for example, to regionally supply the cleaning gas only from both ends of the cleaning gas supply part 32b. For example, the dry cleaning may be performed by dividing the gas introduction space 32d of the cleaning gas supply part 32b into three parts and providing three gas supply pipes corresponding to the respective three parts, performing the first cleaning process by supplying a cleaning gas from the entire three pipes, and performing the second cleaning process by supplying a cleaning gas from only two pipes at both ends.

In this embodiment, an inert gas is supplied from the second reaction gas supply part 32c at a great flow rate, and a cleaning gas is supplied from the cleaning gas supply part 32b in order to perform the local cleaning easily. Thus, an inert gas supplied from the second reaction gas supply part 32c forms a gas pressure wall having a high pressure; the cleaning gas is pushed toward both ends by the pressure wall; and the cleaning gas locally flows to the central region and the outer peripheral region of the susceptor 2, while allowing the local etching to be performed. This allows the surface of susceptor 2 to be cleaned uniformly in the first etching process and the second etching process, thereby achieving the uniform dry cleaning.

After the second cleaning process is sufficiently performed, the processing flow in FIG. 11 can be terminated, and the substrate processing can be continued after carrying a wafer W into the vacuum chamber 1.

Hereinafter, a working example of performing a method for dry cleaning a susceptor according to the embodiment is described below.

EXAMPLE

Figure 12:
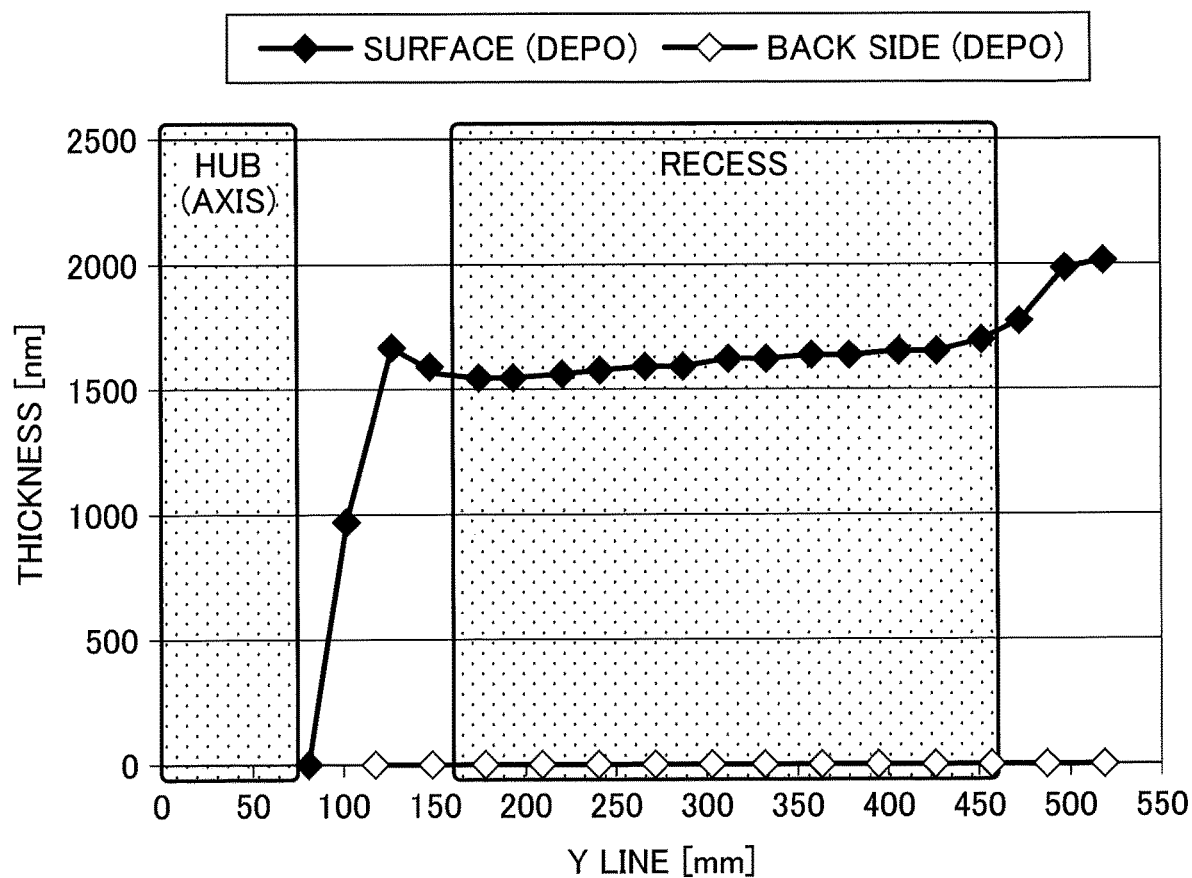
FIG. 12 is a diagram illustrating an example of a radial thickness distribution of a silicon oxide film deposited on a surface of a susceptor.

FIG. 12 is a diagram showing a working example of a radial thickness distribution of a silicon oxide film deposited on a surface of a susceptor 2. In FIG. 12, the horizontal axis shows a distance (mm) from the central axis in the radial direction of the susceptor 2, and the vertical axis shows a film thickness (nm). The hub near the center corresponds to the core portion 21 that supports the susceptor 2, and is not part of the susceptor 2. A concave portion indicates a range of region in which a recess 24 is formed and the wafer W is placed thereon. During the deposition process, the thickness of the film in this region is small because the wafer W is placed on the recess 24. However, because locations of the susceptor 2 between adjacent recesses 24 are also exposed during the deposition process, cleaning is also necessary. Overall, the central (near 0 mm) and outer peripheral (near 550 mm) locations without the recesses 24 have the film thickness thicker than that of the location including the recess 24.

TABLE 1

|  | REGION P1 | | REGION P2 | | REGION P3 | REGION P2 |
| --- | --- | --- | --- | --- | --- | --- |
|  | ClF$_3$ | C—Ar | ClF$_3$ | Ar(O$_3$) | RF Ar | ClF$_3$ |
| FIRST CLEANING | 200 | 1000 | 800 | 500 | 7.5 | φ0.5 |
| SECOND CLEANING | 200 | 1000 | 800 | 6000 | 7.5 | φ0.5 |

Table 1 shows the conditions of the working example of performing the method for dry cleaning the susceptor cleaning according to the present embodiment. The thin film deposited on the susceptor 2 was a silicon oxide film (SiO2).

As shown in Table 1, cleaning gas and argon gas are supplied to both the first processing region P1 and the second processing region P2 in both the first cleaning process and the second cleaning process.

In the first process region P1, the flow rate of the cleaning gas ClF$_3$ was fixed at 200 sccm and the flow rate of the carrier gas Ar was fixed at 1000 sccm in both the first cleaning process and the second cleaning process.

On the other hand, in the second process region P2, the flow rate of the cleaning gas ClF$_3$ was fixed at 800 sccm in both the first cleaning process and the second cleaning process, but argon supplied from the second reaction gas supply part 32c during the dry cleaning was set at 500 sccm in the first cleaning process, and was set 12 times as long as 6000 sccm in the second cleaning process. That is, in the first cleaning process, argon gas was supplied at a small flow rate, and in the second cleaning process, argon gas was supplied at a large flow rate as high as 12 times, while forming a gas pressure wall.

In addition, argon gas was supplied at 7.5 slm in the third process region P3. In addition, the pore size of the gas discharge hole 36 in the cleaning gas supply part 32b of the showerhead 32 was set at 0.5 mm.

Figure 13:
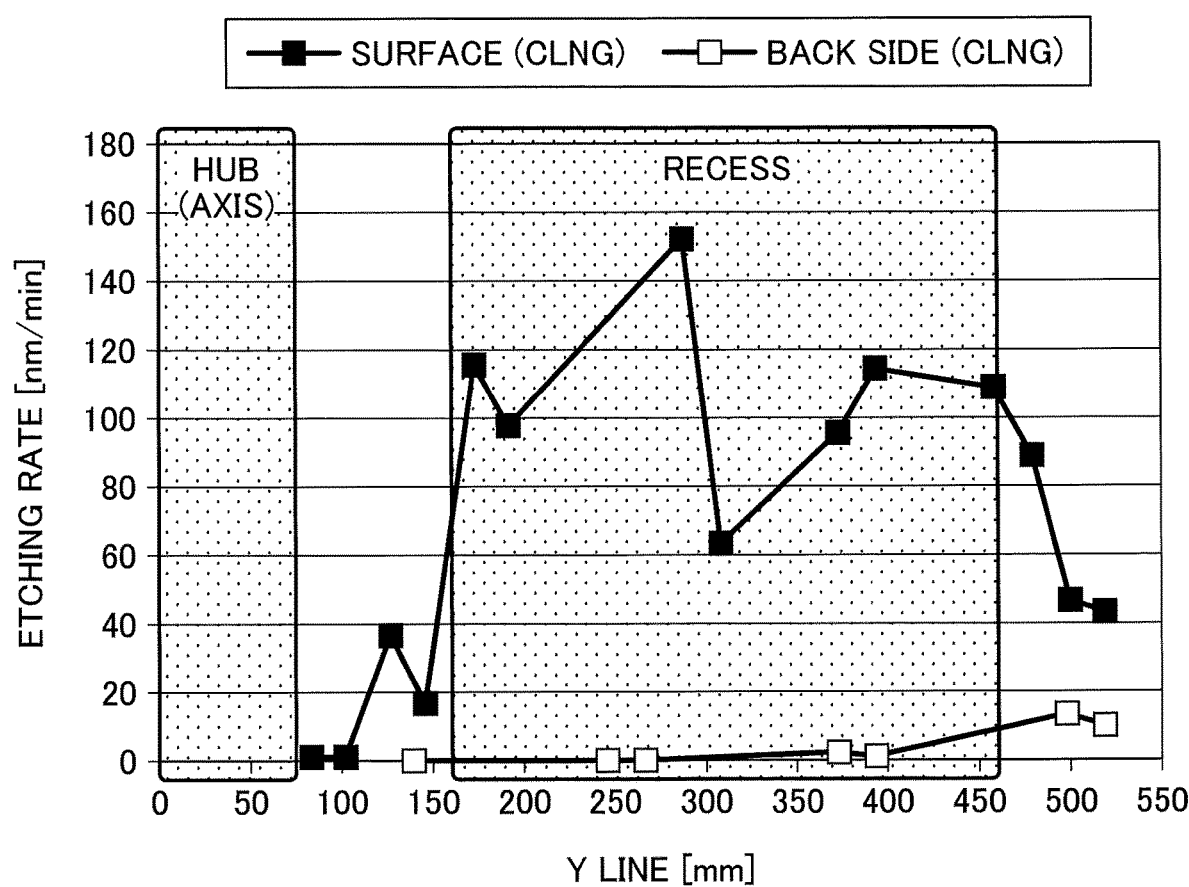
FIG. 13 is a diagram showing a result of a first cleaning process of a method for dry cleaning a susceptor according to an embodiment of the present disclosure.

FIG. 13 is a graph illustrating a result of the first cleaning process of the method for dry cleaning the susceptor according to the present embodiment. In FIG. 13, the horizontal axis shows the distance (mm) from the center of the susceptor and the vertical axis shows the etching rate (nm/min) in the first cleaning process.

As shown in FIG. 13, in the first cleaning process, the silicon oxide film of the main (central) portion in the radial direction of susceptor 2 containing recess 24 could be removed at a high etching rate. On the other hand, the etching rate was low on the center axis side of the susceptor 2 (in the range of 100-160 mm of the Y-axis) and the outer peripheral side (in the range of 460-530 mm of the Y-axis).

The result indicates that effective cleaning was performed in the central region including the recess 24 in the radial direction of susceptor 2, but that insufficient cleaning was performed at both ends of the radial direction.

Figure 14:
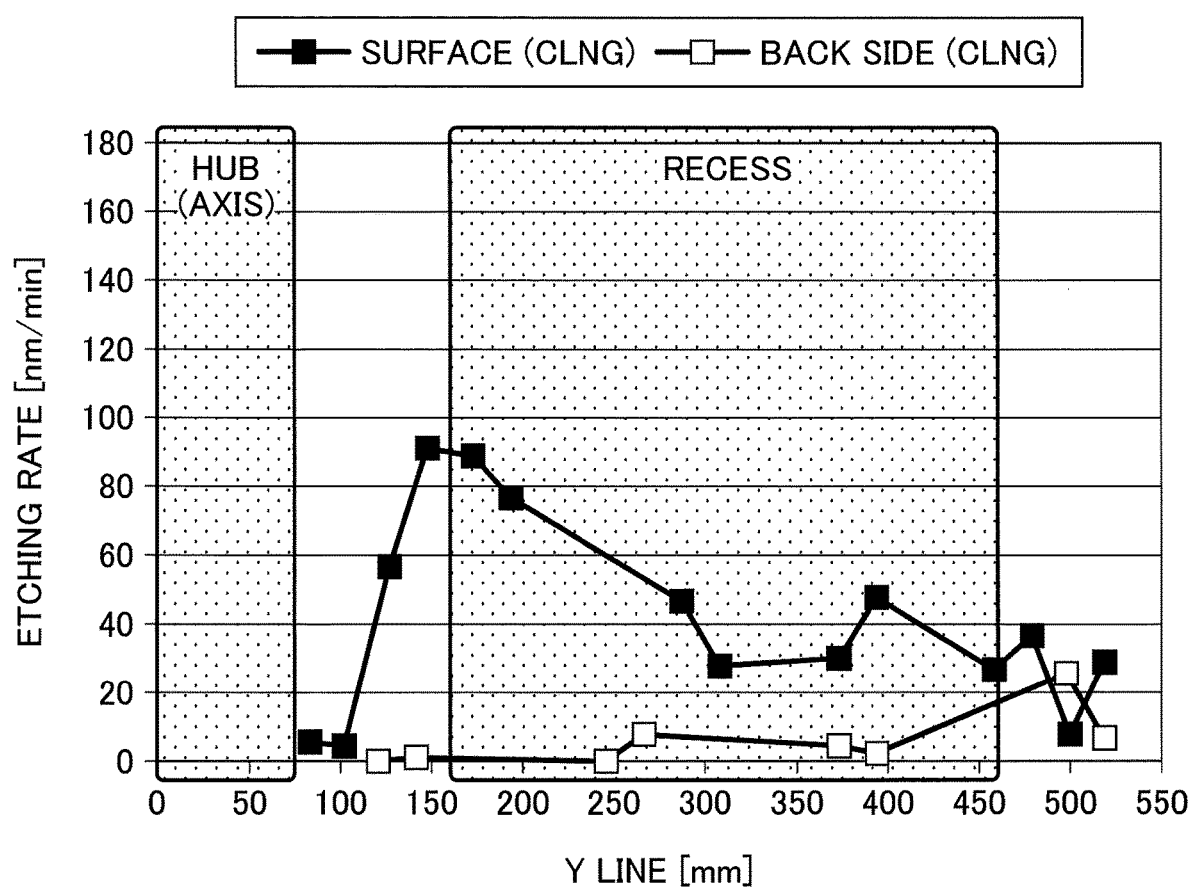
FIG. 14 is a diagram showing a result of a second cleaning process of a method for dry cleaning a susceptor according to an embodiment of the present disclosure.

FIG. 14 is a graph showing a result of a working example of the second cleaning process of the method for dry cleaning the susceptor according to the present embodiment. In FIG. 14, the horizontal axis shows the distance (mm) from the center on the susceptor 2, and the vertical axis shows the etching rate (nm/min) in the second cleaning process.

As shown in FIG. 14, in the second cleaning process, the silicon oxide film deposited on the central side (in the range of 100-160 mm of the Y-axis) and on the outer peripheral side (in the range of 460-530 mm of the Y-axis) that do not include the recess 24 can be removed at a high etch rate. On the other hand, at the main part (center) in the radial direction of the susceptor 2 including the recess 24, the etching rate was lower than the first cleaning process. As a result, in the second cleaning process, the cleaning can be sufficiently performed at both ends in the radial direction of the susceptor 2 to complement the etching of the central and outer peripheral regions where the etching was insufficient in the first cleaning process.

Figure 15:
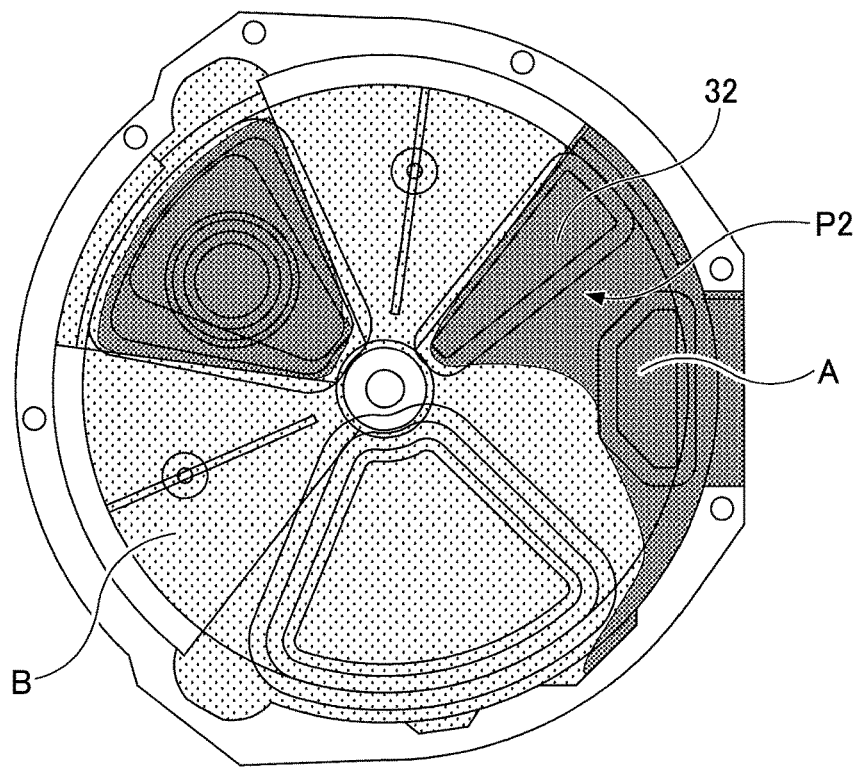
FIG. 15 is a diagram showing a concentration distribution of a cleaning gas in a first etching process.

FIG. 15 is a diagram showing the concentration distribution of the cleaning gas in the first etching process. In FIG. 15, a region A is a region in which the concentration of the cleaning gas is high, and a region B is a region in which the concentration of the cleaning gas is low. That is, the region A is a region in which the silicon oxide film can be etched, and the region B is a region in which the silicon oxide film cannot be etched.

As shown in FIG. 15, in the first etching process, the second processing region is in an overall etchable concentration. However, as shown in FIG. 13, etching is actually insufficient at both ends of susceptor 2 in the radial direction.

Figure 16:
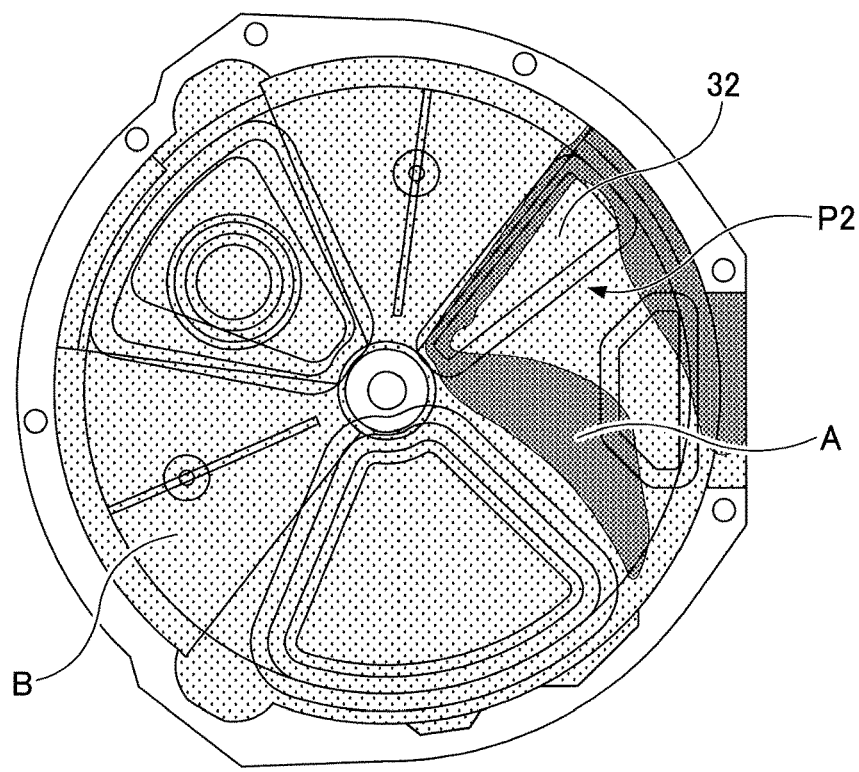
FIG. 16 is a diagram showing the concentration distribution of a cleaning gas in the second etching process.

FIG. 16 is a diagram showing the concentration distribution of the cleaning gas in the second etching process. In FIG. 16, a region A is a region in which the concentration of the cleaning gas is high and the silicon oxide film can be etched, and a region B is a region in which the concentration of the cleaning gas is low and the silicon oxide film cannot be etched.

As shown in FIG. 16, in the second etching process, the central and outer peripheries in the second process region P2 are etchable concentrations. The central region in the radial direction is a non-etchable concentration region. This is because a pressure barrier was formed because the argon gas was supplied at a large flow rate from the second reaction gas supply part 32c downstream of the cleaning gas supply part 32b, and the cleaning gas flew toward both sides. Thus, the flow path of the cleaning gas can be controlled by supplying argon gas from the second reaction gas supply part 32c at a large flow rate to form a pressure wall.

Such flow control may be performed by the controller 100 controlling the flow controllers 121 and 122. In addition, the ratio of the flow rate of the inert gas in the first cleaning process to the second cleaning process is preferably in the range of two times to infinity of the inert gas in the first cleaning process, and preferably in the range of five times to infinity, and preferably in the range of ten times to infinity. It should be noted that the infinity is set because the infinity is infinite when the inert gas is not supplied in the first etching process, that is, when the flow rate is zero. In addition, the inert gas can use a variety of gases, such as argon, helium, nitrogen, and the like, as long as the inert gas does not react with the cleaning gas. The cleaning gas is also not particularly limited as long as the thin film on susceptor 2 can be etched, and various cleaning gases including fluorine-containing gases such as $CF_4$, $C_2F_8$, $C_3F_8$, $CHF_3$, $NF_3$, $F_2$, and the like can be used.

Thus, the method for dry cleaning the susceptor according to the working examples has shown that the entire surface of the susceptor 2 can be cleaned uniformly by executing the two-step dry cleaning.

In the present embodiment, an example of implementing the method for dry cleaning the susceptor is described while using the ALD film deposition apparatus. However, in another substrate processing apparatus, a first cleaning process of dry cleaning a main part and a second cleaning process of cleaning a place that has not been sufficiently cleaned in the first cleaning process can be applied to achieve uniform cleaning. Accordingly, the present disclosure is not limited to the rotational susceptor-type ALD apparatus illustrated in the present embodiment, but is also applicable to an etching apparatus and a CVD apparatus.

In the present embodiment, an example of using a showerhead 32 as a unit for supplying the cleaning gas and the second reaction gas has been described. However, as long as the unit is configured to be able to supply the gas locally, the unit is not needed to be configured as a showerhead. For example, a gas nozzle may be used instead.

Alternatively, the reaction gas nozzle 31 may be configured as a showerhead, or the substrate processing apparatus may be configured not to include a plasma generator 80 and a reaction gas nozzle 33. The substrate processing apparatus according to the embodiments can have various configurations as long as the cleaning gas can be supplied to a first region of a larger region than a second region to clean the main region, and then the entire region can be cleaned by supplying the cleaning gas to a second region of a narrower region than the first region and not overlapping with the first region.

Also, the first reaction gas, the second reaction gas, and the treatment gas are not particularly limited to specific gases, and the method for dry cleaning the susceptor according to the present embodiment can be applied to various substrate processing.

As described above, according to the present disclosure, the entire susceptor surface can be cleaned uniformly.

All examples recited herein are intended for pedagogical purposes to aid the reader in understanding the disclosure and the concepts contributed by the inventor to furthering the art, and are to be construed as being without limitation to such specifically recited examples and conditions, nor does the organization of such examples in the specification relate to a showing of the superiority or inferiority of the disclosure. Although the embodiments of the present disclosure have been described in detail, it should be understood that various changes, substitutions, and alterations could be made hereto without departing from the spirit and scope of the disclosure.

What is claimed is:

1. A method for dry cleaning a susceptor performed after a substrate is removed from a processing chamber of a substrate processing apparatus, comprising steps of:
supplying a cleaning gas for dry cleaning to a first region including a substrate receiving region in the susceptor; and
regionally supplying the cleaning gas to a second region where the cleaning gas is difficult to reach in the step of supplying the cleaning gas to the first region by supplying the cleaning gas to the first region and supplying an inert gas to the first region to form a pressure wall of the inert gas to direct the cleaning gas toward the second region, a flow rate of the inert gas being greater than a flow rate of the cleaning gas, wherein the cleaning gas is supplied from a cleaning gas supply part, the cleaning gas supply part has a plurality of cleaning gas discharge holes, wherein the inert gas is supplied from a reaction gas supply part for substrate processing, the reaction gas has a plurality of reaction gas discharge holes, wherein the susceptor is rotatable, wherein the cleaning gas supply part is disposed upstream of the reaction gas supply part in a rotational direction of the susceptor, and the second region is a region on a rotational center side of the susceptor and a region on an outer peripheral side of the susceptor.

2. The method of claim 1, wherein the susceptor has a plurality of substrate receiving regions along a circumferential direction of the susceptor, and wherein the cleaning gas supply part and the reaction gas supply part are provided extending along a radial direction of the susceptor.

3. The method of claim 2, wherein the cleaning gas supply part and the reaction gas supply part are configured to have discharge holes in a bottom surface of a showerhead.

4. The method of claim 1, wherein the substrate processing apparatus is an ALD apparatus, and wherein the cleaning gas is capable of etching a film deposited on the susceptor.

5. The method of claim 4, wherein the cleaning gas is a fluorine atom containing gas.

* * * * *